US012762295B2

(12) United States Patent
Beltrand

(10) Patent No.: US 12,762,295 B2
(45) Date of Patent: Oct. 13, 2026

(54) 3D RECONSTRUCTION FROM IMAGES

(71) Applicant: DASSAULT SYSTEMES, Velizy Villacoublay (FR)

(72) Inventor: Nicolas Beltrand, Vélizy-Villacoublay (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 555 days.

(21) Appl. No.: 18/305,276

(22) Filed: Apr. 21, 2023

(65) Prior Publication Data

US 2023/0342507 A1 Oct. 26, 2023

(30) Foreign Application Priority Data

Apr. 21, 2022 (EP) .................................... 22305599

(51) Int. Cl.

*G06F 30/10* (2020.01)
*G06T 7/10* (2017.01)
*G06T 17/00* (2006.01)
*G06V 10/82* (2022.01)

(52) U.S. Cl.

CPC ................ *G06F 30/10* (2020.01); *G06T 7/10* (2017.01); *G06T 17/00* (2013.01); *G06V 10/82* (2022.01); *G06T 2207/20081* (2013.01)

(58) Field of Classification Search

CPC .......... G06F 30/10; G06F 30/12; G06F 30/17; G06F 30/27; G06F 2111/08; G06T 7/10; G06T 17/00; G06T 7/162; G06T 7/12; G06T 17/20; G06T 17/10; G06T 2207/20081; G06T 2207/10028;

(Continued)

(56) References Cited

U.S. PATENT DOCUMENTS

2011/0069866 A1* 3/2011 Kim .......................... G06T 7/12 382/209
2020/0380685 A1* 12/2020 Gilboa ...................... G06T 1/20
2021/0174585 A1* 6/2021 Huber ...................... G06N 3/08

(Continued)

FOREIGN PATENT DOCUMENTS

CN 110349247 A * 10/2019 ............ G06T 17/00
CN 115953534 A * 4/2023 ............ G06V 10/80

(Continued)

OTHER PUBLICATIONS

Uy et al. "Point2Cyl: Reverse Engineering 3D Objects from Point Clouds to Extrusion Cylinders." arXiv preprint arXiv:2112.09329 (2021) (Year: 2021).*

(Continued)

*Primary Examiner* — Henok Shiferaw

(74) *Attorney, Agent, or Firm* — Oblon, McClelland, Maier & Neustadt, L.L.P.

(57) ABSTRACT

A computer-implemented method of 3D reconstruction of at least one real object comprising an assembly of parts. The 3D reconstruction method includes obtaining a neural network configured for generating a 3D primitive CAD object based on an input depth image, obtaining a natural image and a depth image representing the real object, segmenting the depth image based at least on the natural image, each segment representing at most a respective part of the assembly, and applying the neural network to each segment.

24 Claims, 9 Drawing Sheets

(58) Field of Classification Search
CPC G06T 2207/20084; G06T 2207/20104; G06V 10/82; G06N 3/0464; G06N 3/09
See application file for complete search history.

(56) References Cited

U.S. PATENT DOCUMENTS

| | | | | |
|---|---|---|---|---|
| 2021/0225000 | A1 * | 7/2021 | Guo | G16H 30/40 |
| 2021/0375043 | A1 * | 12/2021 | Jiang | G06V 10/82 |
| 2023/0147722 | A1 * | 5/2023 | Ramirez de Chanlatte | G06N 3/0442 345/419 |

FOREIGN PATENT DOCUMENTS

| | | |
|---|---|---|
| EP | 3 327 593 A1 | 5/2018 |
| EP | 3 675 062 A1 | 7/2020 |
| EP | 3 859 685 A1 | 8/2021 |
| EP | 3 945 495 A1 | 2/2022 |
| EP | 4 092 558 A1 | 11/2022 |

OTHER PUBLICATIONS

Zou, Chuhang, et al. "3d-prnn: Generating shape primitives with recurrent neural networks." Proceedings of the IEEE International Conference on Computer Vision. 2017. (Year: 2017).*
Jia, Qingyu, et al. "Real-time 3D reconstruction method based on monocular vision." Sensors 21.17 (2021): 5909. (Year: 2021).*
He, Qian, et al. "Single image 3d object estimation with primitive graph networks." Proceedings of the 29th ACM International Conference on Multimedia. 2021. (Year: 2021).*
Niu, Chengjie, Jun Li, and Kai Xu. "Im2struct: Recovering 3d shape structure from a single rgb image." Proceedings of the IEEE conference on computer vision and pattern recognition. 2018. (Year: 2018).*
Danielczuk, Michael, et al. "Segmenting unknown 3d objects from real depth images using mask r-cnn trained on synthetic data." 2019 International Conference on Robotics and Automation (ICRA). IEEE, 2019. (Year: 2019).*
Extended European Search Report issued Oct. 5, 2022, in European Patent Application No. 22305599.7, 11 pages.
Wu et al., "MarrNet: 3Dshape reconstruction via 2.5D sketches", arXiv preprint, arXiv:1711.03129, 2017, pp. 1-11.
https://en.wikipedia.org/wiki/AlexNet, 2023, pp. 1-4.
Uy, M.A., et al., "Point2Cyl: Reverse Engineering 3D Objects from Point Clouds to Extrusion Cylinders", arxiv.org, Cornell University Library, 201 Olin Library Cornell University Ithaca, NY 14853, Dec. 17, 2021 (Dec. 17, 2021), pp. 1-18.
Stanescu, A., et al., "Semantic Segmentation of Geometric Primitives in Dense 3D Point Clouds", 2018 IEEE International Symposium on Mixed and Augmented Reality Adjunct (ISMAR-Adjunct), IEEE, Oct. 16, 2018 (Oct. 16, 2018), pp. 206-211.
Zou, C., et al., "3D-PRNN: Generating Shape Primitives with Recurrent Neural Networks", 2017 IEEE International Conference on Computer Vision (ICCV), IEEE, Oct. 22, 2017 (Oct. 22, 2017), pp. 900-909.
Buonamici, F., et al., "Reverse engineering modeling methods and tools: a survey", Computer-Aided Design and Applications, vol. 15, No. 3, Nov. 16, 2017 (Nov. 16, 2017), pp. 443-464.
He, Q., et al., "Single Image 3D Object Estimation with Primitive Graph Networks", arxiv.org, Cornell University Library, 201 Olin Library Cornell University Ithaca, NY 14853, Sep. 9, 2021 (Sep. 9, 2021), 12 total pages.
Chen, X., et al., "AutoSweep: Recovering 3D Editable Objectsfrom a Single Photograph", arxiv.org, vol. 14, No. 8, May 28, 2020 (May 28, 2020), pp. 1-10.
U.S. Appl. No. 18/072,455, filed Nov. 30, 2022, Thibault Dominique Marie Bernard Rose.
Gkioxari et al., "Mesh R-CNN"—Proceedings of the IEEE/CVF International Conference on Computer Vision, 2019, pp. 1-15.

* cited by examiner

3D RECONSTRUCTION FROM IMAGES

CROSS-REFERENCE TO RELATED APPLICATIONS

This application claims priority under 35 U.S.C. § 119 or 365 to European Application No. 22305599.7, filed Apr. 21, 2022. The entire contents of the above application are incorporated herein by reference.

TECHNICAL FIELD

The disclosure relates to the field of computer programs and systems, and more specifically to a method, system and program for 3D reconstruction of at least one real object comprising an assembly of parts.

BACKGROUND

A number of solutions, hardware and software, are offered on the market for the design, the engineering and the manufacturing of objects. CAD is an acronym for Computer-Aided Design, e.g., it relates to software solutions for designing an object. CAE is an acronym for Computer-Aided Engineering, e.g., it relates to software solutions for analyzing and simulating the physical behavior of a future product. CAM is an acronym for Computer-Aided Manufacturing, e.g., it relates to software solutions for defining product manufacturing processes and resources. In such computer-aided design solutions, the graphical user interface plays an important role as regards the efficiency of the technique. These techniques may be embedded within Product Lifecycle Management (PLM) solutions. PLM refers to an engineering strategy that helps companies to share product data, apply common processes, and leverage corporate knowledge for the development of products from conception to the end of their life, across the concept of extended enterprise. The PLM solutions provided by Dassault Systèmes (under the trademarks CATIA, SIMULIA, DELMIA and ENOVIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the solutions deliver common models linking products, processes, resources to enable dynamic, knowledge-based product creation and decision support that drives optimized product definition, manufacturing preparation, production and service.

Some of these systems and programs provide functionalities for reconstructing 3D objects, i.e., to infer a voxel or mesh representation, from an image containing objects to reconstruct.

Document Gkioxari et al., "*Mesh R-CNN*", Proceedings of the IEEE/CVF International Conference on Computer Vision, 2019, discloses a method that detects objects in real-world images and produces a triangle mesh giving the full 3D shape of each detected object. Said method augments Mask R-CNN with a mesh prediction branch that outputs meshes with varying topological structure by first predicting coarse voxel representations which are converted to meshes and refined with a graph convolution network operating over the mesh's vertices and edges.

Document Wu et al., "MarrNet: 3Dshape reconstruction via 2.5D sketches", arXiv preprint, arXiv:1711.03129, 2017, discloses an end-to-end trainable model that sequentially estimates 2.5D sketches and 3D object shape.

These methods need a large amount of training data which should be close to real data. Such datasets are not available. The training of these methods mostly relies on CAD datasets consisting of CAD models (like ShapeNet, see https://shapenet.org) which are not real objects, thereby introducing biases in the dataset. In addition, a trained neural network according to this method may have difficulties to generalize to new types of objects not represented in the dataset, to uncommon object designs, and/or to uncommon scene contexts (e.g., a pillow on a chair, or a man occluding the object to reconstruct).

Within this context, there is still a need for an improved solution for 3D reconstruction of at least one real object comprising an assembly of parts.

SUMMARY

It is therefore provided a computer-implemented method of 3D reconstruction of at least one real object comprising an assembly of parts. The 3D reconstruction method comprises providing a neural network configured for generating a 3D primitive CAD object based on an input depth image, providing a natural image and a depth image representing the real object, segmenting the depth image based at least on the natural image, each segment representing at most a respective part of the assembly, and applying the neural network to each segment.

The method may comprise one or more of the following:

- the neural network comprises a convolutional network (CNN) that takes the depth image as input and outputs a respective latent vector, and a sub-network that takes the respective latent vector as input and outputs values of a predetermined 3D primitive CAD object parameterization;
- the 3D primitive CAD object is defined by a section and an extrusion, the section being defined by a list of positional parameters and a list of line types, and the neural network comprises a recurrent neural network (RNN) configured to output a value for the list of positional parameters and the list of line types;
- the neural network further comprises a fully connected layer that outputs value of one or more parameters defining the extrusion;
- the section is further defined by a number representing a type of the section, the neural network being further configured to compute a vector representing a probability distribution for the number, and, optionally, the outputting of the value for the one or more parameters defining the extrusion, the list of positional parameters, and/or for the list of line types, is further based on the vector representing the probability distribution;
- the neural network comprises:
  - a first part comprising:
    - a first subpart comprising a convolutional network (CNN), the CNN being configured to take the depth image as input and to output a respective latent vector, and
    - a second subpart which is configured to take the respective latent vector of the CNN as input and to output the vector representing a probability distribution for the number; and
  - a second part comprising:
    - a third subpart which is configured to take as input a concatenation of the respective latent vector of the CNN and the vector representing the probability distribution, and to output a respective vector, a fourth subpart which is configured to take as input the respective vector of the third subpart and to output a value for the list of positional parameters, a value for the list of line types, and a fixed-length vector, and a fifth subpart which is configured to take as input a concatenation of the respective vector of the third subpart and the respective fixed-length vector of the fourth subpart, and to output a value for the one or more parameters defining the extrusion; and/or the method comprises before applying the neural network to each segment removing outliers from the segment, and/or recentering the segment.

It is further provided a computer-implemented method for learning the neural network. The learning method comprises providing a dataset of training samples each including a respective depth image and a ground truth 3D primitive CAD object, and training the neural network based on the dataset.

It is further provided a computer-implemented method for forming the dataset comprising synthesizing 3D primitive CAD objects, and generating a respective depth image of each synthesized 3D primitive CAD object.

The method may comprise one or more of the following:

generating a respective depth image of each synthesized 3D primitive CAD object comprises rendering the synthesized 3D primitive CAD object with respect to a virtual camera thereby obtaining a set of pixels, and, optionally, the synthesized 3D primitive CAD object is subjected to one or more transformation before the rendering;

further comprising adding a random noise to at least part of the pixels; and/or further comprising adding a random occlusion to at least part of the pixels.

It is further provided a computer program comprising instructions for performing the method.

It is further provided a computer readable storage medium having recorded thereon the computer program.

It is further provided a system comprising a processor coupled to a memory, the memory having recorded thereon the computer program.

BRIEF DESCRIPTION OF THE DRAWINGS

Non-limiting examples will now be described in reference to the accompanying drawings, where.

DETAILED DESCRIPTION

Figure 1:
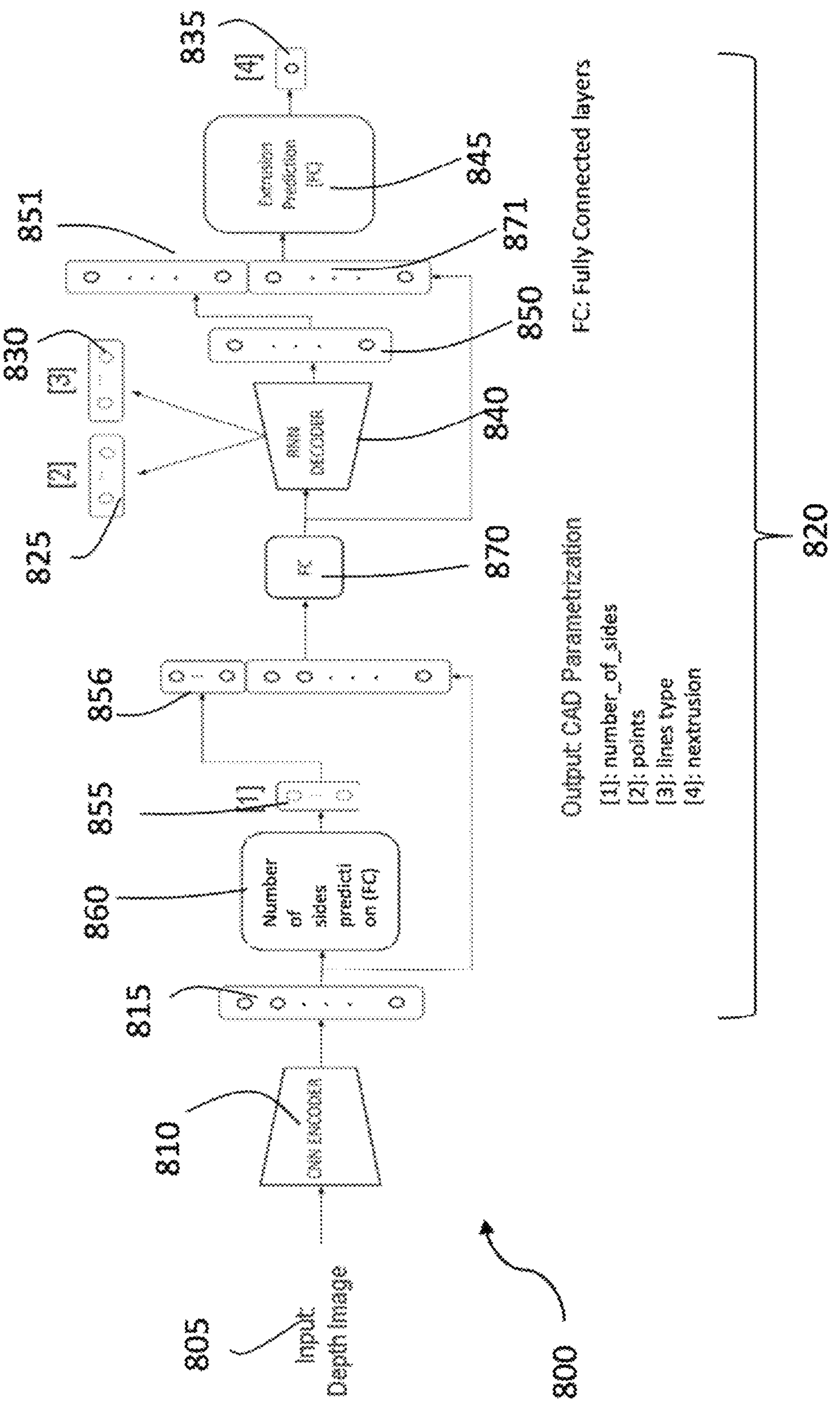
FIG. 1 shows an example of the neural network in the method.

It is proposed a computer-implemented method of 3D reconstruction of at least one real object comprising an assembly of parts. The 3D reconstruction method comprises providing a neural network configured for generating a 3D primitive CAD object based on an input depth image. The 3D reconstruction method also comprises providing a natural image and a depth image representing the real object. The 3D reconstruction method further comprises segmenting the depth image based at least on the natural image, and applying the neural network to each segment. Each segment represents at most a respective part of the assembly.

Such a method improves 3D reconstruction by applying a neural network, which is configured for generating a 3D primitive CAD object based on an input depth image, to individual segments of the depth image that are such that each segment represents at most one respective part. Notably, training a neural network for 3D reconstruction of segments of a depth image which includes only one part is easier compared to 3D reconstruction of the entire input image. Thereby, the provided neural network does not need to be trained on large and realistic datasets which are not available. Furthermore, a single object is less complicated than the entirety of an image to be 3D reconstructed, such that applying the 3D reconstruction method to each segment of the input depth image separately improves the accuracy of the final 3D reconstruction.

On the other hand, the provided neural network is configured to output a respective 3D primitive CAD object. Primitive CAD objects (as discussed later hereinbelow) are capable to accurately approximate real-world objects while providing a simple and efficient parametrization. Such a parameterized reconstruction of a real object allows an easy manipulation and/or editability and/or efficient storage in memory, as opposed to non-parameterized 3D models such as discrete representations (e.g., point clouds, meshes, or voxel representations).

The method further exploits a segment of the input depth image to infer the 3D CAD object, i.e., by applying the (learnt/trained) neural network to each segment of the input depth image. Using a depth image is beneficial for an inference for 3D reconstruction compared to a natural (e.g., an RGB) image, as a depth image comprises data about a distance between a viewpoint (e.g., a camera sensor) and location of objects in the depth image. Such data provide information on the shape and relative positions of objects thereby improving the 3D reconstruction.

Furthermore, as the neural network is configured to perform the 3D reconstruction by application on an input depth image, the training datasets required for training such a neural network are allowed to cover less variety of training samples. Specifically, these datasets may not include combination of colors and/or shadowing of the assembly of parts, thereby being smaller in size. Obtaining such smaller training datasets is easier and the neural network can be learned faster (i.e., with less computational cost) on such datasets. Thus, the method improves the learning of a neural network for a 3D reconstruction.

By "3D reconstruction" it is meant constructing a 3D representation of an object. The 3D reconstruction may be integrated in a method for designing a 3D modeled object represented upon the 3D reconstruction. For example, first the 3D reconstruction method may be executed to obtain one or more 3D reconstructions of a real object comprising an assembly of parts. Such a 3D reconstruction comprises one or more 3D primitive CAD objects thereby being editable. The 3D reconstruction may be then inputted to the method for designing a 3D modeled object. "Designing a 3D modeled object" designates any action or series of actions which is at least part of a process of elaborating a 3D modeled object. Thus, the method may comprise creating the 3D modeled object from such a 3D reconstruction. The real object may be a mechanical part and be manufactured upon completion of the design process. Thus, the 3D reconstruction obtained by the method is particularly relevant in manufacturing CAD, that is software solutions to assist design processes and manufacturing processes. Indeed, this 3D reconstruction facilitates obtaining a model of an object to be manufactured from a 2D input data, such as an image of said object. Within this context, the 3D reconstruction is a 3D model representing a manufacturing product, that may be manufactured downstream to its design. The method may thus be part of such a design and/or manufacturing process. The method may for example form or be part of a step of 3D CAD model reconstruction from provided images (e.g., for reverse engineering a mechanical object displayed in the images). The method may be included in many other applications which use the CAD models parametrized by the method. In any case, the modeled object designed by the method may represent a manufacturing object. The modeled object may thus be a modeled solid (i.e., a modeled object that represents a solid). The manufacturing object may be a product, such as a part, or an assembly of parts. Because the method improves the design of the modeled object, the method also improves the manufacturing of a product and thus increases productivity of the manufacturing process.

The 3D reconstruction method generally manipulates modeled objects. A modeled object is any object defined by data stored e.g., in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system.

By CAD solution (e.g. a CAD system or a CAD software), it is additionally meant any system, software or hardware, adapted at least for designing a modeled object on the basis of a graphical representation of the modeled object and/or on a structured representation thereof (e.g. a feature tree), such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g., representing a product such as a part or an assembly of parts, or possibly an assembly of products. By "3D modeled object" or "3D CAD object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. In other words, 3D CAD object allows a 3D reconstruction of an object. The display of a 3D representation facilitates design (i.e., increases the speed at which designers statistically accomplish their task). This speeds up the manufacturing process in the industry, as the design of the products is part of the manufacturing process.

The 3D modeled object may represent the geometry of a product to be manufactured in the real world subsequent to the completion of its virtual design with for instance a CAD software solution or CAD system, such as a (e.g. mechanical) part or assembly of parts (or equivalently an assembly of parts, as the assembly of parts may be seen as a part itself from the point of view of the method, or the method may be applied independently to each part of the assembly), or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled object designed by the method may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

By PLM system, it is additionally meant any system adapted for the management of a modeled object representing a physical manufactured product (or product to be manufactured). In a PLM system, a modeled object is thus defined by data suitable for the manufacturing of a physical object. These may typically be dimension values and/or tolerance values. For a correct manufacturing of an object, it is indeed better to have such values.

By CAE solution, it is additionally meant any solution, software of hardware, adapted for the analysis of the physical behavior of a modeled object. A well-known and widely used CAE technique is the Finite Element Model (FEM) which is equivalently referred to as CAE model hereinafter. An FEM typically involves a division of a modeled object into elements, i.e., a finite element mesh, which physical behaviors can be computed and simulated through equations. Such CAE solutions are provided by Dassault Systèmes under the trademark SIMULIA®. Another growing CAE technique involves the modeling and analysis of complex systems composed a plurality of components from different fields of physics without CAD geometry data. CAE solutions allow the simulation and thus the optimization, the improvement and the validation of products to manufacture. Such CAE solutions are provided by Dassault Systèmes under the trademark DYMOLA®.

By CAM solution, it is meant any solution, software of hardware, adapted for managing the manufacturing data of a product. The manufacturing data generally include data related to the product to manufacture, the manufacturing process and the required resources. A CAM solution is used to plan and optimize the whole manufacturing process of a product. For instance, it may provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. For example, a CAM solution may provide the information regarding machining parameters, or molding parameters coherent with a provided extrusion feature in a CAD model. Such CAM solutions are provided by Dassault Systèmes under the trademarks CATIA, Solidworks or trademark DELMIA®.

CAD and CAM solutions are therefore tightly related. Indeed, a CAD solution focuses on the design of a product or part and CAM solution focuses on how to make it. Designing a CAD model is a first step towards a computer-aided manufacturing. Indeed, CAD solutions provide key functionalities, such as feature based modeling and boundary representation (B-Rep), to reduce the risk of errors and the loss of precision during the manufacturing process handled with a CAM solution. Indeed, a CAD model is intended to be manufactured. Therefore, it is a virtual twin, also called digital twin, of an object to be manufactured with two objectives:

- checking the correct behavior of the object to be manufactured in a specific environment; and
- ensuring the manufacturability of the object to be manufactured.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, salespeople and buyers. A PDM solution is generally based on a product-oriented database. It allows the actors to share consistent data on their products and therefore prevents actors from using divergent data. Such PDM solutions are provided by Dassault Systèmes under the trademark ENOVIA®.

The generation of a custom computer program from CAD files may be automated. Such generation may therefore be error prone and may ensure a perfect reproduction of the CAD model to a manufactured product. CNC is considered to provide more precision, complexity and repeatability than is possible with manual machining. Other benefits include greater accuracy, speed and flexibility, as well as capabilities such as contour machining, which allows milling of contoured shapes, including those produced in 3D designs.

The method may be included in a production process, which may comprise, after performing the method, producing a physical product corresponding to the modeled object outputted by the method. The production process may comprise the following steps:

- (e.g. automatically) applying the method, thereby obtaining the CAD model or CAE model outputted by the method;
- optionally, (e.g. automatically) converting the obtained CAE model into a CAD model as previously discussed, using a (e.g. automatic) CAE to CAD conversion process;
- using the obtained CAD model for manufacturing the part/product.

Converting the CAE model into a CAD model may comprise executing the following (e.g. fully automatic) conversion process that takes as input a CAE and converts it into a CAD model comprising a feature-tree representing the product/part. The conversion process includes the following steps (where known fully automatic algorithms exist to implement each of these steps):

- segmenting the CAE model, or an outer surface/skin thereof, thereby obtaining a segmentation of the CAE model into segments, e.g. each forming a surface portion of the model;
- detecting geometries of CAD features by processing the segments, e.g. including detecting segments or groups of segments each forming a given CAD feature geometry (e.g. an extrusion, a revolution, or any canonic primitive), and optionally geometric characteristics thereof (e.g. extrusion axis, revolution axis, or profiles);
- parameterizing the detected geometries, e.g. based on the geometries and/or on said geometric characteristics thereof;
- fitting CAD operators each to a respective portion of the CAE model, based on a geometry of said portion, for example by aggregating neighboring segments detected as being part of a same feature geometry;
- encoding the geometries and the corresponding CAD operators into a feature tree;
- optionally, executing the feature tree, thereby obtaining a B-rep representation of the product;
- outputting the feature tree and optionally the B-rep, the feature tree and optionally the B-rep forming the CAD model.

Using a CAD model for manufacturing designates any real-world action or series of action that is/are involved in/participate to the manufacturing of the product/part represented by the CAD model. Using the CAD model for manufacturing may for example comprise the following steps:

- editing the obtained CAD model;
- performing simulation(s) based on the CAD model or on a corresponding CAD model (e.g. the CAE model from which the CAD model stems, after a CAE to CAD conversion process), such as simulations for validation of mechanical, use and/or manufacturing properties and/or constraints (e.g. structural simulations, thermodynamics simulation, aerodynamic simulations);
- editing the CAD model based on the results of the simulation(s); (i.e. depending on the manufacturing process used, the production of the mechanical product may or may not comprise this step) (e.g. automatically) determining a manufacturing file/CAM file based on the (e.g. edited) CAD model, for production/manufacturing of the manufacturing product;
- sending the CAD file and/or the manufacturing file/CAM file to a factory; and/or
- (e.g. automatically) producing/manufacturing, based on the determined manufacturing file/CAM file or on the CAD model, the mechanical product originally represented by the model outputted by the method. This may include feeding (e.g. automatically) the manufacturing file/CAM file and/or the CAD file to the machine(s) performing the manufacturing process.

This last step of production/manufacturing may be referred to as the manufacturing step or production step. This step manufactures/fabricates the part/product based on the CAD model and/or the CAM file, e.g. upon the CAD model and/or CAD file being fed to one or more manufacturing machine(s) or computer system(s) controlling the machine(s). The manufacturing step may comprise performing any known manufacturing process or series of manufacturing processes, for example one or more additive manufacturing steps, one or more cutting steps (e.g. laser cutting or plasma cutting steps), one or more stamping steps, one or more forging steps, one or more molding steps, one or more machining steps (e.g. milling steps) and/or one or more punching steps. Because the design method improves the design of a model (CAE or CAD) representing the part/product, the manufacturing and its productivity are also improved.

Editing the CAD model may comprise, by a user (i.e. a designer), performing one or more of the CAD models, e.g. by using a CAD solution. The modifications of the CAD model may include one or more modifications each of a geometry and/or of a parameter of the CAD model. The modifications may include any modification or series of modifications performed on a feature tree of the model (e.g. modification of feature parameters and/or specifications) and/or modifications performed on a displayed representation of the CAD model (e.g. a B-rep). The modifications are modifications which maintain the technical functionalities of the part/product, i.e. the user performs modifications which may affect the geometry and/or parameters of the model but only with the purpose of making the CAD model technically more compliant with the downstream use and/or manufacturing of the part/product. Such modifications may include any modification or series of modification that make the CAD model technically compliant with specifications of the machine(s) used in the downstream manufacturing process. Such modifications may additionally or alternatively include any modification or series of modification that make the CAD model technically compliant with a further use of the product/part once manufactured, such modification or series of modifications being for example based on results of the simulation(s).

The CAM file may comprise a manufacturing step up model obtained from the CAD model. The manufacturing step up may comprise all data required for manufacturing the mechanical product so that it has a geometry and/or a distribution of material that corresponds to what is captured by the CAD model, possibly up to manufacturing tolerance errors. Determining the production file may comprise applying any CAM (Computer-Aided Manufacturing) or CAD-to-CAM solution for (e.g. automatically) determining a production file from the CAD model (e.g. any automated CAD-to-CAM conversion algorithm). Such CAM or CAD-to-CAM solutions may include one or more of the following software solutions, which enable automatic generation of manufacturing instructions and tool paths for a given manufacturing process based on a CAD model of the product to manufacture:

- Fusion 360,
- FreeCAD,
- CATIA,
- SOLIDWORKS,
- The NC Shop Floor programmer of Dassault Systèmes illustrated on my.3dexperience.3ds.com/welcome/fr/compass-world/rootroles/nc-shop-floor-programmer,
- The NC Mill-Turn Machine Programmer of Dassault Systèmes illustrated on my.3dexperience.3ds.com/welcome/fr/compass-world/rootroles/nc-mill-turn-machine-programmer, and/or
- The Powder Bed Machine Programmer of Dassault Systèmes illustrated on my.3dexperience.3ds.com/welcome/fr/compass-world/rootroles/powder-bed-machine-programmer.

The product/part may be an additive manufacturable part, i.e. a part to be manufactured by additive manufacturing (i.e. 3D printing). In this case, the production process does not comprise the step of determining the CAM file and directly proceeds to the producing/manufacturing step, by directly (e.g. and automatically) feeding a 3D printer with the CAD model. 3D printers are configured for, upon being fed with a CAD model representing a mechanical product (e.g. and upon launching, by a 3D printer operator, the 3D printing), directly and automatically 3D print the mechanical product in accordance with the CAD model. In other words, the 3D printer receives the CAD model, which is (e.g. automatically) fed to it, reads (e.g. automatically) the CAD model, and prints (e.g. automatically) the part by adding together material, e.g. layer by layer, to reproduce the geometry and/or distribution of material captured by the CAD model. The 3D printer adds the material to thereby reproduce exactly in reality the geometry and/or distribution of material captured by the CAD model, up to the resolution of the 3D printer, and optionally with or without tolerance errors and/or manufacturing corrections. The manufacturing may comprise, e.g. by a user (e.g. an operator of the 3D printer) or automatically (by the 3D printer or a computer system controlling it), determining such manufacturing corrections and/or tolerance errors, for example by modifying the CAD file to match specifications of the 3D printer. The production process may additionally or alternatively comprise determining (e.g. automatically by the 3D printer or a computer system controlling it) from the CAD model, a printing direction, for example to minimize overhang volume (as described in European Patent No. 3327593, which is incorporated herein by reference), a layer-slicing (i.e., determining thickness of each layer, and layer-wise paths/trajectories and other characteristics for the 3D printer head (e.g., for a laser beam, for example the path, speed, intensity/temperature, and other parameters).

The product/part may alternatively be a machined part (i.e. a part manufactured by machining), such as a milled part (i.e. a part manufactured by milling). In such a case, the production process may comprise a step of determining the CAM file. This step may be carried out automatically, by any suitable CAM solution to automatically obtain a CAM file from a CAD model of a machined part. The determination of the CAM file may comprise (e.g. automatically) checking if the CAD model has any geometric particularity (e.g. error or artefact) that may affect the production process and (e.g. automatically) correcting such particularities. For example, machining or milling based on the CAD model may not be carried out if the CAD model still comprises sharp edges (because the machining or milling tool cannot create sharp edges), and in such a case the determination of the CAM file may comprise (e.g. automatically) rounding or filleting such sharp edges (e.g. with a round or fillet radius that corresponds, e.g. substantially equals up to a tolerance error, the radius of the cutting head of the machining tool), so that machining or milling based on the CAD model can be done. More generally, the determination of the CAM file may automatically comprise rounding or filleting geometries within the CAD model that are incompatible with the radius of the machining or milling tool, to enable machining/milling. This check and possible corrections (e.g. rounding or filleting of geometries) may be carried out automatically as previously discussed, but also, by a user (e.g. a machining engineer), which performs the correction by hand on a CAD and/or CAM solution, e.g. the solution constraining the user to perform corrections that make the CAD model compliant with specifications of the tool used in the machining process.

Further to the check, the determination of the CAM file may comprise (e.g. automatically) determining the machining or milling path, i.e. the path to be taken by the machining tool to machine the product. The path may comprise a set of coordinates and/or a parameterized trajectory to be followed by the machining tool for machining, and determining the path may comprise (e.g. automatically) computing these coordinates and/or trajectory based on the CAD model. This computation may be based on the computation of a boundary of a Minkowski subtraction of the CAD model by a CAD model representation of the machining tool, as for example discussed in European Patent Application 21306754.9 filed on 13 Dec. 2021 by Dassault Systèmes, and which is incorporated herein by reference. It is to be understood that the path may be a single path, e.g. that the tool continuously follows without breaking contact with the material to be cut. Alternatively, the path may be a concatenation of a sequence sub-paths to be followed in a certain order by the tool, e.g. each being continuously followed by the tool without breaking contact with the material to be cut. Optionally, the determination of the CAM file may then comprise (e.g. automatically) setting machine parameters, including cutting speed, cut/pierce height, and/or mold opening stroke, for example based on the determined path and on the specification of the machine. Optionally, the determination of the CAM file may then comprise (e.g. automatically) configuring nesting where the CAM solution decides the best orientation for a part to maximize machining efficiency.

In this case of a machining or milling part, the determining of the CAM file thus results in, and outputs, the CAM file comprising a machining path, and optionally the set machine parameters and/or specifications of the configured nesting. This outputted CAM file may be then (e.g. directly and automatically) fed to the machining tool and/or the machining tool may then (e.g. directly and automatically) be programmed by reading the file, upon which the production process comprises the producing/manufacturing step where the machine performs the machining of the product according to the production file, e.g. by directly and automatically executing the production file. The machining process comprises the machining tool cutting a real-world block of material to reproduce the geometry and/or distribution of material captured by the CAD model, e.g. up to a tolerance error (e.g. tens of microns for milling).

The product/part may alternatively be a molded part, i.e. a part manufactured by molding (e.g. injection-molding). In such a case, the production process may comprise the step of determining the CAM file. This step may be carried out automatically, by any suitable CAM solution to automatically obtain a CAM file from a CAD model of a molded part. The determining of the CAM file may comprise (e.g. automatically) performing a sequence of molding checks based on the CAD model to check that the geometry and/or distribution of material captured by the CAD model is adapted for molding, and (e.g. automatically) performing the appropriate corrections if the CAD model is not adapted for molding. Performing the checks and the appropriate corrections (if any) may be carried out automatically, or, alternatively, by a user (e.g. a molding engineer), for example using a CAD and/or CAM solution that allows a user to perform the appropriate corrections on the CAD model but constraints him/her corrections that make the CAD model compliant with specifications of the molding tool(s). The checks may include: verifying that the virtual product as represented by the CAD model is consistent with the dimensions of the mold and/or verifying that the CAD model comprises all the draft angles required for demolding the product, as known per se from molding. The determining of the CAM file may then further comprise determining, based on the CAD model, a quantity of liquid material to be used for molding, and/or a time to let the liquid material harden/set inside the mold, and outputting a CAM file comprising these parameters. The production process then comprises (e.g. automatically) performing the molding based on the outputted file, where the mold shapes, for the determined hardening time, a liquid material into a shape that corresponds to the geometry and/or distribution of material captured by the CAD model, e.g. up to a tolerance error (e.g. up to the incorporation of draft angles or to the modification of draft angles, for demolding).

The product/part may alternatively be a stamped part, also possibly referred to as "stamping part", i.e. a part to be manufactured in a stamping process. The production process may in this case comprise (e.g. automatically) determining a CAM file based on the CAD model. The CAD model represents the stamping part, e.g. possible with one or more flanges if the part is to comprise some, and possibly in this latter case with extra material to be removed so as to form an unfolded state of one or more flanges of the part, as known per se from stamping. The CAD model thus comprises a portion that represents the part without the flanges (which is the whole part in some cases) and possibly an outer extra patch portion that represents the flanges (if any), with possibly the extra material (if any). This extra patch portion may present a g2-continuity over a certain length and then a g1-continuity over a certain length.

The determination of the CAM file may in this stamping case comprise (e.g. automatically) determining parameters of the stamping machine, for example a size of a stamping die or punch and/or a stamping force, based on the geometry and/or distribution of material of the virtual product as captured by the CAD model. If the CAD model also comprises the representation of the extra material to be removed so as to form an unfolded state of one or more flanges of the part, the extra material to be removed may for example be cut by machining, and determining the CAM file may also comprise determining a corresponding machining CAM file, e.g. as discussed previously. If there are one or more flanges, determining the CAM file may comprise determining geometrical specifications of the g2-continuity and g1-continuity portions that allow, after the stamping itself and the removal of the extra material, to fold in a folding process the flanges towards an inner surface of the stamped part and along the g2-continuity length. The CAM file thereby determined may thus comprise: parameters of the stamping tool, optionally said specifications for folding the flanges (if any), and optionally a machining production file for removing the extra material (if any).

The stamping production process may then output, e.g. directly and automatically, the CAM file, and perform the stamping process (e.g. automatically) based on the file. The stamping process may comprise stamping (e.g. punching) a portion of material to form the product as represented by the CAD file, that is possibly with the unfolded flanges and the extra material (if any). Where appropriate, the stamping process may then comprise cutting the extra material based on the machining production file and folding the flanges based on said specifications for folding the flanges, thereby folding the flanges on their g2-continuity length and giving a smooth aspect to the outer boundary of the part. In this latter case, the shape of the part once manufactured differ from its virtual counterpart as represented by the CAD model in that the extra material is removed and the flanges are folded, whereas the CAD model represents the part with the extra material and the flanges in an unfolded state.

The method comprises providing a neural network configured for generating a 3D primitive CAD object based on an input depth image. As known from the field of machine-learning, a "neural network" is a function comprising operations according to an architecture, each operation being defined by data including weight values. Such operations are interdependently applied to an input according to an architecture. The architecture of the neural network defines the operand of each operation and the relation between the weight values. The provided neural network may be trained, i.e., learnt and ready to use. The training of a neural network thus includes determining values of the weights based on a dataset configured for such learning.

It is further proposed such a computer-implemented method for learning the neural network of the 3D reconstruction method. The learning method comprises providing a dataset of training samples each including a respective depth image and a ground truth 3D primitive CAD object, and training the neural network based on the dataset. The dataset thus includes data pieces each forming a respective training sample. The training of the neural network (which includes determining the values of the weight as discussed above) may be according to any known supervised learning method based on the training samples. The training samples represent the diversity of the situations where the neural network is to be used after being learnt. Any dataset referred herein may comprise a number of training samples higher than 1000, 10000, 100000, or 1000000. The provided dataset may be a "synthetic" dataset resulting from a computer-implemented for forming such a dataset.

It is further proposed such a computer-implemented method for forming the dataset of the learning method. The dataset-forming method comprises synthesizing 3D primitive CAD objects, and generating a respective depth image of each synthesized 3D primitive CAD object.

Now, the 3D reconstruction method is discussed.

As discussed above, the method comprises providing a neural network configured for generating a 3D primitive CAD object based on an input depth image. By "configured for generating a 3D primitive CAD object based on an input depth image", it is meant that the provided neural network takes as an input a depth image and outputs a respective 3D primitive CAD object. As known in the 3D computer graphics and computer vision field, a "depth image" or equivalently a "depth map" is an image or image channel that contains information relating to a distance of surfaces of scene objects from a viewpoint. Such an image may be obtained by Lidar technology (using a laser beam, e.g., an IR laser beam) for example Kinect, ultrasonic technology, structure-from-motion (i.e., 3D reconstruction 3D from several images), depth estimation method, depth-estimation, (i.e., obtaining a depth image from a single RGB image to indicate relative depths). By a "3D primitive CAD object" it is meant any CAD object which represents a primitive shape, that is, a shape obtainable by a sweep. In other words, each primitive shape is defined by sweeping a section (e.g., a planar section) along a guide curve. The section may be any polygon, any rounded polygon (i.e., a polygon with rounded corners), or any other set of one or more curves which forms a closed region, for example one or more spline curves. The guide curve may a straight line or a continuous curve.

The section may be continuously deformed along the guide curve. A sphere, for example, is thus a primitive shape, as a sphere may be obtained by the sweep along a diameter of the sphere of a circle starting with radius zero (i.e., thus a point) and then, while sweeping, continuously increasing the radius until half the sphere's diameter and then continuously decreasing the radius until zero again.

By applying a neural network configured for generating a 3D primitive CAD object to each segment, the method thus reconstructs a respective primitive shape per segment. By restraining the reconstruction to primitive shapes in particular, the method achieves relatively high trainability and thus relatively high accuracy. If more complex shapes were to be reconstructed, the neural network would be less easy to be trained, or even not trainable at all.

The method may be restricted such that the neural network is configured for generating only particular sub-categories of 3D primitive CAD objects each time it is applied to an input depth image. For example, the neural network may be configured to only output 3D primitive CAD objects having a non-deformed section (i.e., sweep of a section which is fixed along the sweep), and/or to only output 3D primitive CAD objects where the guide curve is straight line.

The method further comprises providing a natural image and a depth image representing the real object. By a "natural image" it is meant a photograph, such as a color (e.g., RGB) photograph or a grayscale photograph. The natural image may display a real-world scene including the real object. The depth image may be in association with the natural image. In other words, the natural image and the provided depth image both represent a same real object. In examples, the natural image and the associated depth image may both represent the real object from a same viewpoint.

The method may comprise capturing the natural image (e.g., with a photo sensor) and/or capturing directly the depth image (e.g., with a depth sensor) or one or more photo images (e.g., with a photo sensor) then transformed into the depth image by depth-estimation or structure-from-motion analysis. The method may comprise capturing the natural image with a respective camera and the depth image or its pre-transform photo image(s) with a distinct respective camera, or both with the same camera (e.g., having distinct sensors, for example including a photo sensor and a depth sensor). The method may comprise providing the natural image and/or the depth image by retrieving from a database or a persistent memory. The method may also retrieve one or more photo images from a database then may transform the photo images into the depth image by depth-estimation or structure-from-motion analysis as known in the field.

The method further comprises segmenting the depth image based at least on the natural image, such that each segment represents at most a respective part of the assembly. In other words, "at most" means that either said respective part presents (at least substantially) a primitive shape and the segment represents the whole part, or alternatively the segment represents only a portion of the part, and in such case said portion presents (at least substantially) a primitive shape. By "based on the natural image" it is meant that segmentation uses (i.e., processes) the natural image in the segmentation. For example, the method may comprises obtaining an edges image by applying an edge-detection method to the natural image. Such edge detection method may be performed according to the Canny method, the Sobel method, or a deep learning method (e.g., Holistically-Nested Edge Detection (HED) method) or any other known method in the field. In particular, the 3D reconstruction method may perform such a segmentation based on the method for segmenting an object in at least one image acquired by a camera which is disclosed in European Patent Application No. 20305874.8 filed on 30 Jul. 2020 by Dassault Systèmes (published under No. 3945495) which is incorporated herein by reference.

Then, the method comprises applying the neural network to each segment. The application of the neural network to each segment generates a respective 3D primitive CAD model as a part of the 3D reconstruction of the real object. In other words, the method performs the 3D reconstruction of the real object segment-by-segment. In examples, the method may process and recenters each segment before applying the neural network to the segment.

In examples, upon the application of the neural network and generation a respective 3D primitive CAD object from each segment of the provided depth image, the method may perform a snapping method to combine the 3D primitive CAD objects obtained from each segment in order to construct the 3D reconstruction of the real object. The snapping method may, in particular, comprise displacement of one or more generated 3D primitive CAD objects relative to each other in a virtual scene. Alternatively or additionally, the snapping method may comprise defining a relation between one or more generated 3D primitive CAD objects. The defining of a relation between the one or more 3D primitive CAD objects may be defining a relation between two or more faces of the objects (e.g., parallel).

The method may, upon the application of the neural network and generation a respective 3D primitive CAD object from each segment of the provided depth image, further comprise outputting a set of the 3D primitive CAD objects. Additionally, the method may further comprise storing and/or displaying such a set of the 3D primitive CAD objects. In examples, the method may further allow a user to edit each of the 3D primitive CAD objects of the set, for example using a GUI.

In examples, the neural network comprises a convolutional network (CNN) that takes the depth image as input and outputs a respective latent vector, and a sub-network that takes the respective latent vector as input and outputs values of a predetermined 3D primitive CAD object parameterization. Examples of such parametrization are discussed later.

FIG. 1 presents a neural network 800 according to such examples. The neural network 800 comprises the CNN 810 which takes the input depth image 805 and outputs the respective latent vector 815. The neural network 800 further comprises a sub-network 820 which accepts the latent vector 815 and outputs values 825, 830, 835 and 855 of a predetermined 3D primitive CAD object parameterization.

In examples, the 3D primitive CAD object is defined by a section and an extrusion. The section is defined by a list of positional parameters and a list of line types. The neural network may comprise a recurrent neural network (RNN) configured to output a value for the list of positional parameters and the list of line types. This provides a simple and compact editable parameterization of the 3D primitive CAD object and forms an improved solution for learning the method (as the neural network can be learnt on a smaller dataset) thereby improving the accuracy of the 3D reconstruction. The section may be 2D, i.e., planar, and/or consist of two or more sides, each side being either a straight line (segment) or a curved line (arc). The list of positional parameters may comprise coordinates of points on the section, for example coordinates of vertices delimiting two-by-two each side of the section. The list of line types may comprise a number indicating a type of a line connecting two consecutive points specified by the list of positional parameters. In examples where the section is a polygon, the positional parameters are the coordinates of the vertices of the polygon. In examples, each value of the list of line types may designate if a respective side of the section is a straight line, or a curve, e.g., a circular curve or a spline curve. In particular examples, the circular curve may have a radius equal to half of distance of two points. Each of the list of positional parameters and the list of line types may be a fixed length vector.

FIG. 1 presents a neural network 800 further according to such examples. In this case, the neural network 800 comprises the RNN 840. The RNN 840 is a part of the sub-network 820 and is configured to output a value for the list of positional parameters 825 and the list of line types 830.

In examples, the neural network may further comprise a fully connected layer (FC) that outputs value of one or more parameters defining the extrusion. Such a value of the one or more parameters defining the extrusion may be based on a final state of the RNN. In other words, the fully connected FC layer may accept as an input the final state of the RNN. The one or more parameters defining the extrusion may comprise an extrusion length (or equivalently extrusion height) when the extrusion is a straight line, for example perpendicular to the section. Alternatively, the one or more parameters defining the extrusion may comprise one or more parameters defining a sweep curve.

In examples, the predetermined parametrization of the 3D primitive CAD object including the list of positional parameters, the list of line types, together with the one or more parameters defining the extrusions.

FIG. 1 presents a neural network 800 further according to such examples. The neural network 800 comprises the fully connected layer 845. The fully connected layer 845 accepts final state 850 of the RNN 840 as a part of its input 851 and outputs value of one or more parameters 835 which defines the extrusion.

In examples, the section is further defined by a number representing a type of the section. In such examples, the neural network may be further configured to compute a vector representing a probability distribution for the number. By "a vector representing a probability distribution for the number" where the number represents a type of the section, it is meant that each argument/coordinate/component of the vector is in correspondence to a (probability of) a respective type of the section. The outputting of the value for the one or more parameters defining the extrusion, the list of positional parameters, and/or for the list of line types, is further based on the vector representing the probability distribution. The representing number of the type of the section, thus, may represent a number of the sides (e.g., segments or arcs) forming the section (nbSides), for example number of edges in a polygon. The neural network may be configured to compute the number representing a type of the section based on the computed vector representing a probability distribution for the number. The neural network may compute the number from the computed vector using an argmax function. In other words, the neural network may attribute the number by application of the argmax function to the computed vector. As known in the field of machine-learning, an argmax function is an operation that finds an argument (e.g., among elements of a vector) that gives a maximum value from a target function. Thereby the argmax function being applied on the computed vector may output a representation of a respective type of the section.

FIG. 1 presents a neural network 800 further according to such examples which computes the vector 855 representing a probability distribution for the number. Further, the rest of the computation in the network 800 is based on the vector 856 which is based on the vector 855 (by a concatenation).

In examples, the neural network comprises a first part comprising a first subpart comprising a convolutional network (CNN). The CNN may be configured to take the depth image as input and to output a respective latent vector. The first part may further comprise a second subpart which is configured to take the respective latent vector of the CNN as input and outputs the vector representing a probability distribution for the number. In other words, the second subpart predicts a respective number of sides of the section. In examples, the second subpart may be a fully connected layer.

The neural network may further comprise a second part comprising a third subpart. The third subpart may be configured to take as input a concatenation of the respective latent vector of the CNN and the vector representing the probability distribution, and to output a respective vector. In examples, the third subpart may be a fully connected layer.

The second part may further comprise a fourth subpart which is configured to take as input the respective vector of the third subpart and to output a value for the list of positional parameters, a value for the list of line types, and a fixed-length vector. In examples, the fourth subpart comprises the RNN as discussed above. The fourth subpart may in addition comprise two fully connected layers configured to output a value configured to output a value for the list of positional parameters and the list of line types based on (predicted) RNN states. Such RNN states may be hidden. In such examples, the fixed-length vector may be a last RNN state.

The second part may further comprise a fifth subpart. The fifth subpart may be configured to take as input a concatenation of the respective vector of the third subpart and the respective fixed-length vector of the fourth subpart and to output a value of the one or more parameters defining the extrusion. In examples, the fifth subpart may be a fully connected layer.

FIG. 1 presents a neural network 800 further according to such examples. The first sub-part of the neural network 800 comprises the CNN 810 which takes the input depth image 805 and output the respective latent vector 815. The second subpart of the neural network 800 comprises the fully connected layer 860 which predicts a respective number of sides of the section of the 3D primitive CAD object. The fully connected layer 860 takes as input the respective latent vector 815 of the CNN 810 of the first subpart and outputs the vector 855 which represent a probability distribution for the number. The third subpart of the neural network 800 comprises the fully connected layer 870 which takes as input the concatenation 856 of the respective latent vector 815 of the CNN 810 and the vector 855. The fully connected layer 870 outputs the respective vector 871. Then, the fourth subpart of the neural network 800 comprises the RNN 840 which takes as input the respective vector 871. The fourth subpart then outputs the value 825 for the list of positional parameters, the value 830 for the list of line types, and the fixed-length vector 850. The fifth subpart of the neural network 800 comprises the fully connected layer 845 which takes as input the concatenation 851 of the respective vector 871 of the third subpart and the respective fixed-length vector 850 of the fourth subpart. The fifth subpart then outputs the value 845 of the one or more parameters defining the extrusion.

In examples, the method may comprise, before applying the neural network to each segment removing outliers from the segment, recentering the segment. The recentering may comprise adding a padding layer around the segment. This improves the solution provided by the method in unifying the input of the neural network as centered. The outliers may appear in the segment due to noise of a sensor (capturing the depth image), errors appearing in the segmentation, and/or object dependent depth noise (e.g., due to illumination, or texture). In examples, the method may remove outliers by representing the (segment of the) depth image with a 3D point cloud and removing outlier pixels of the depth image using a statistical point cloud outlier removal strategy. Such a strategy may remove points that are further away from their neighbors compared to the average for the point cloud. Each outlier removal strategy may lead to a different input of the neural network and thereby a different output (i.e., a different 3D primitive CAD object). In examples, the method may apply multiple outlier removal strategies on a segment thereby obtaining multiple 3D primitive CAD object for a segment from the neural network, each respective to an outlier removal strategy. The multiple outlier removal strategies may be any statistical to determinist strategy (e.g., setting pixels of depth map on edges to zero). This improves the method by proposing several 3D primitive CAD object for a segment.

Now the learning method is discussed.

As discussed above the learning method comprises providing a dataset of training samples each including a respective depth image and a ground truth 3D primitive CAD object and training the neural network based on the dataset. The ground truth 3D primitive CAD object may be included in the dataset by adding respective values of a predetermined 3D primitive CAD object parameterization as discussed above. As known from the field of machine-learning, the learning (or equivalently training) may comprise iteratively processing a respective dataset, for example mini-batch-by-mini-batch and modifying weight values of the neural network along the iterative processing. This may be performed according to a stochastic gradient descent. The weight values may be initialized for each training. The weight values may be initialized in any arbitrary manner, for example randomly or each to the zero value. In examples, the learning method may strop performing iterations if a convergence is realized (e.g., in the values of the weights).

The learning may comprise minimizing a loss function, wherein the loss function represents a disparity between each of the (ground truth) 3D primitive CAD object of training samples and a respective generated 3D primitive CAD object outputted from the neural network from a respective inputted depth image of the trainings samples. The loss may penalize a disparity between the predetermined parametrization of the 3D primitive CAD object computed and outputted by the neural network and the (ground truth) 3D primitive CAD object of training samples or a parametrization thereof.

In examples, the disparity may comprise a mean-squared error between the positional parameters (e.g., coordinates of the points) defining the section of each 3D primitive CAD object of the training samples and their respective predicted values by the neural network and/or a mean-squared error between the one or more parameters defining the extrusion (e.g., an extrusion length) of each 3D primitive CAD object of the training samples and their respective predicted values by the neural network.

Alternatively or additionally, the disparity may comprise a metric of a difference between the type of section of each 3D primitive CAD object of the training samples and the type, or a value of the probability distribution for the number representing the type, computed by the neural network.

Figure 2:
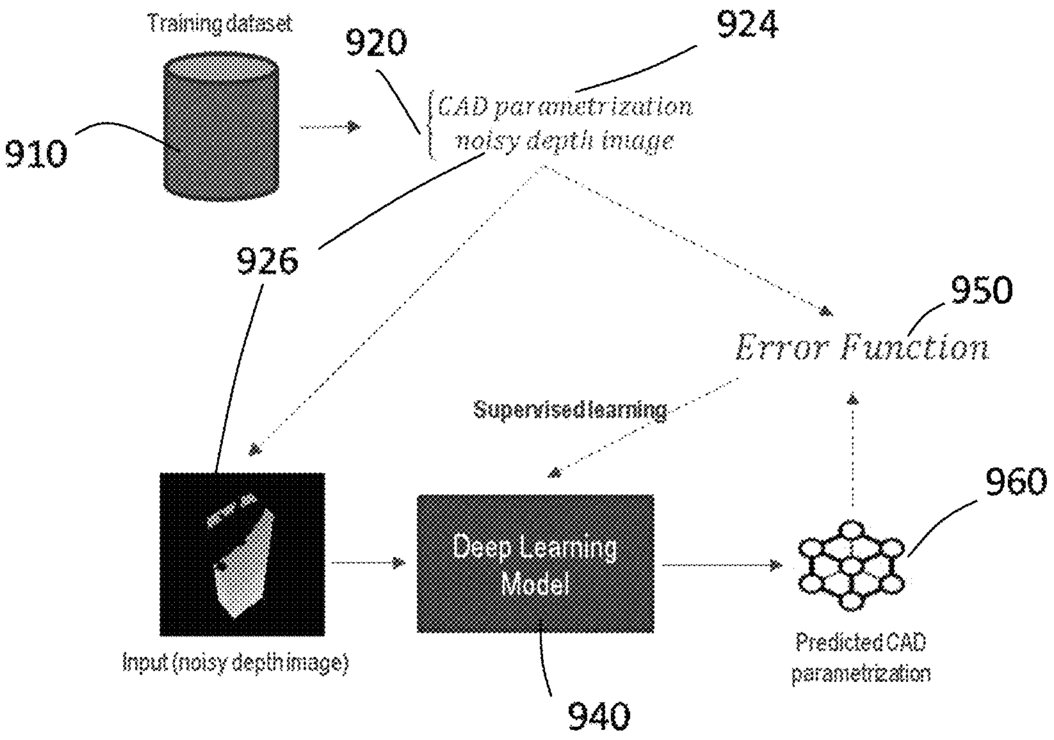
FIG. 2 shows an example of the learning of a neural network according to the method.

FIG. 2 presents an example of the learning method according to a supervised learning. The learning method exploits a training dataset 910 comprises training samples 920. Each training sample 920 comprises a CAD parametrization 924 (as a representation of a respective ground truth 3D primitive CAD object) in association of depth image 926 which may be noisy. The learning method trains the Deep Learning Model 940 (i.e., a provided neural network) by inputting the depth image 926 and computing an error function (or a loss) 950 between the predicted CAD parametrization 960 (outputted by the model 940) and the CAD parametrization 924 in order to update the weights of the model 940. The learning method perform iterations until a convergence (e.g., a convergence in the values of the weights).

The learning of the neural network method may for example be performed at least partly based on the dataset formed by the dataset-forming method, in examples after the dataset-forming method. Such a machine-learning process is particularly efficient and provides improved accuracy. Alternatively, a machine-learning process may comprise the dataset-forming method and performing, based on the dataset, any other computer-implemented method (than the proposed learning method) for learning the neural network. Yet alternatively, a machine-learning process may comprise performing the learning method on a dataset provided by any other computer-implemented method (than the proposed dataset-forming method), such as another method for forming a dataset or retrieval of a dataset as such. In examples, the training of the neural network may be performed on the part of the dataset formed by the dataset-forming method.

In examples, the 3D primitive CAD object may be one of the primitives with a guide curve which is not necessarily normal to the section and a polygonal section. In such examples, the one or more parameters defining the extrusion may comprise a vector, i.e., an extrusion vector, defining an extrusion direction and the extrusion length (in said direction). In specific examples, the guide curve is a straight line normal to the section. Thereby the one or more extrusion parameters is an extrusion height. The positional parameters may be the coordinates of the vertices of the polygon. In examples, the method may have a maximum value for the number of vertices of the polygon to perform the learning process more efficiently by limiting the learning to the objects that are more probably to appear in practice. In such examples the training of the neural network may comprise a supervised training which includes minimizing a loss (L). The loss may penalize a summation of one or more of the following terms:

an extrusion loss with a term of the type $$\lambda_1 \frac{1}{N} \Sigma_{n=1}^{N} \|h_n - \widehat{h_n}\|^2$$

representing a disparity of the predicted extrusion vector and the extrusion vector of the 3D primitive CAD objects. Here, $h_n$ designates said respective extrusion vector and $\widehat{h_n}$ designates the respective predicted $h_n$. In specific examples discussed above, the extrusion vector (and the predicted extrusion vector thereof) may be a scaler defining the extrusion height;

a point loss with a term of the type $$\lambda_2 \frac{1}{N} \sum_{n=1}^{N} \min_{s \in [\![0, nbSides_n - 1]\!]} \left( \sum_{i=0}^{nbSides_n - 1} \|\hat{p}_{n,i} - \mathrm{SHIFT}_2(p_{n,i})\|^2 \right)$$

representing a disparity of the coordinates of the points of the section of a 3D primitive CAD object and their corresponding predicted values. Here, i designates the said point and each $p_{n,i}$ designates said respective coordinates of a ground truth point[i][0] or point[i][1] of respective 3D primitive CAD object n, and $\widehat{p_{n,i}}$ designates the respective predicted $p_{n,i}$. Further, $\mathrm{SHIFT}_s$ (array) designates a function to shift each element of array to the right s times. This function allows not penalizing a circular permutation of the predicted set of points;

a line type loss $L_{lineTypes}$ which is of the type of a categorical cross entropy loss as $$-\lambda_3 \frac{1}{N} \sum_{n=1}^{N} \frac{1}{5} \sum_{k=1}^{5} linesType_{n,k} \cdot \log(\widehat{linesType}_{n,k})$$

representing a disparity between the type of lines connecting each two consecutive points of the section of a 3D primitive CAD object and their corresponding predicted type of lines. Here, operator · is a dot product, $linesType_{n,k}$ designates the probability vector (of a length equal to the number of different line types) for respective $k^{th}$ line, and $\widehat{linesType}_{n,k}$ designates the predicted probability vector (of a length equal to the number of different line types) for respective $k^{th}$ line. Each component of the vectors $linesType_{n,k}$, (respectively, $\widehat{linesType}_{n,k}$) represent the (respectively, predicted) probability that the line type of $k^{th}$ line is of a respective type associated to that component. One component of the vector $linesType_{n,k}$ respective to the (ground truth) type of $k^{th}$ line may be equal to 1 while the remaining component may be 0. The sum of the components of $\widehat{linesType}_{n,k}$ (i.e., the sum of different probabilities may be equal to 1, because a softmax operation may be applied the vector. In examples, there may be two types of lines, straight lines (i.e., type 0) and curved lines with circular curves having a radius equal to half of distance of two points (i.e., type 1). In such examples, $\widehat{linesType}_{n,k}$ is of length 2 where, for respective $k^{th}$ line, the first component is the predicted probability that the $k^{th}$ line is of type 0, and the second component is the predicted probability that the $k^{th}$ line is of type 1. The sum of the probabilities is 1, because of a softmax operation applied on prediction in fact). $linesType_{n,k}$ is a vector of same shape but for the ground truth (target line type probability is 1); and a number of sides loss with a term of the type $$-\lambda_4 \frac{1}{N} \sum_{1}^{N} \sum_{k=0}^{5} (nbSides_n == k) \log(\widehat{s_n(k)})$$

(in which the maximum value for the number of vertices of the polygon is set to 5) representing a disparity of the type of the 3D primitive CAD objects the corresponding predicted type. Here, $nbSides_n$ is the nbSides (i.e., number of sides) ground truth for the nth example. Further, $s_n(k)$ designates the predicted probability that respective 3D primitive CAD object is of type k. Further, $nbSides_n$==k designates a function which gives 1 when k is equal to $nbSides_n$ and 0 otherwise.

Here N designates the number of training samples and n refers to each of the 3D primitive CAD objects of training samples. Further, $\lambda_1$, $\lambda_2$, $\lambda_3$, and $\lambda_4$ designate the weights to set to balance between variability and target reconstruction reliability. In an example, $(\lambda_1,\lambda_2,\lambda_3,\lambda_4)$ may be set as (10.0, 10.0, 1.0, 1.0).

Now the dataset-forming method is discussed.

As discussed above the dataset-forming method comprises synthesizing 3D primitive CAD objects, and generating a respective depth image of each synthesized 3D primitive CAD object. The dataset-forming method may be performed before the learning method.

The dataset-forming method may synthesize 3D primitive CAD objects by sampling (e.g., a random sampling) from one or more parameter domains. The random sampling may a uniform sampling, i.e., according to a uniform probability distribution. In examples the synthetizing may comprise generating a random integer representing the type of the section, and, generating, based on the number, the list of positional parameters and the value for the extrusion. Hence, the 3D primitive CAD object is fully defined. The positional parameters of the section may correspond to the corners of the section and may be chosen on a unit circle. Alternatively, the positional parameters of the section and the value for the extrusion length may be chosen to obtain the biggest 3D primitive CAD object corresponding to the set of these positional parameters and the extrusion fitting in the unit sphere, for example upon a scaling.

In examples, the generating a respective depth image of each synthesized 3D primitive CAD object may comprise rendering the synthesized 3D primitive CAD object with respect to a virtual camera thereby obtaining a set of pixels. The synthesized 3D primitive CAD object may be subjected to one or more transformation before the rendering. The set pixels comprise background pixels and foreground (primitive) pixels. The foreground pixels are the pixels representing an object (i.e., inside a region defined by said object on the image) with an intensity higher than zero in the depth image while the background pixels are outside of the object. The one or more transformations may be such that at least part of an area of the object (e.g., bottom) is visible by the virtual camera. The one or more transformations may comprise one or more of recentering, scaling, rotation, and/or translation. Furthermore, the generating of a respective depth image may apply a padding on a final result of transformation (by adding background pixels with zero values) in order to obtain a square image.

In examples, the dataset-forming further comprises adding a random noise to at least part of the pixels. For example, the method may add a 2D Perlin noise on every foreground pixel of the depth image, a random Gaussian noise on every foreground pixel, and/or an absolute value of random Gaussian noise on the boundaries of the foreground pixels. Adding such noises enriches the formed dataset as it is closer to practical cases (with presence of noise) and improves the accuracy of a neural network trained on such a dataset.

In examples, the dataset-forming method further comprises adding a random occlusion to at least part of the pixels. For example, the method may add a random occlusion in a form of an ellipse of or a rectangle. Such an occlusion may cover (i.e., occlude) a specific percentage of the foreground pixels of the depth image, for example between 5 to 50 percent. Such an occlusion may be in particular near the boundaries of the depth image. Alternatively or additionally, the dataset-forming method may add a random number of occlusions near the boundaries of the foreground pixels. The random number may have a maximum number depending on the number of foreground pixels. Such occlusions can be elliptic or rectangular shapes with parameter lengths from 3 to 10 pixels.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined. For example, the user may control the segmenting the depth image by inputting some strokes by a mouse, a touchpad or any other haptic device.

A typical example of computer-implementation of a method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g., one for the program, and possibly one for the database).

Figure 3:
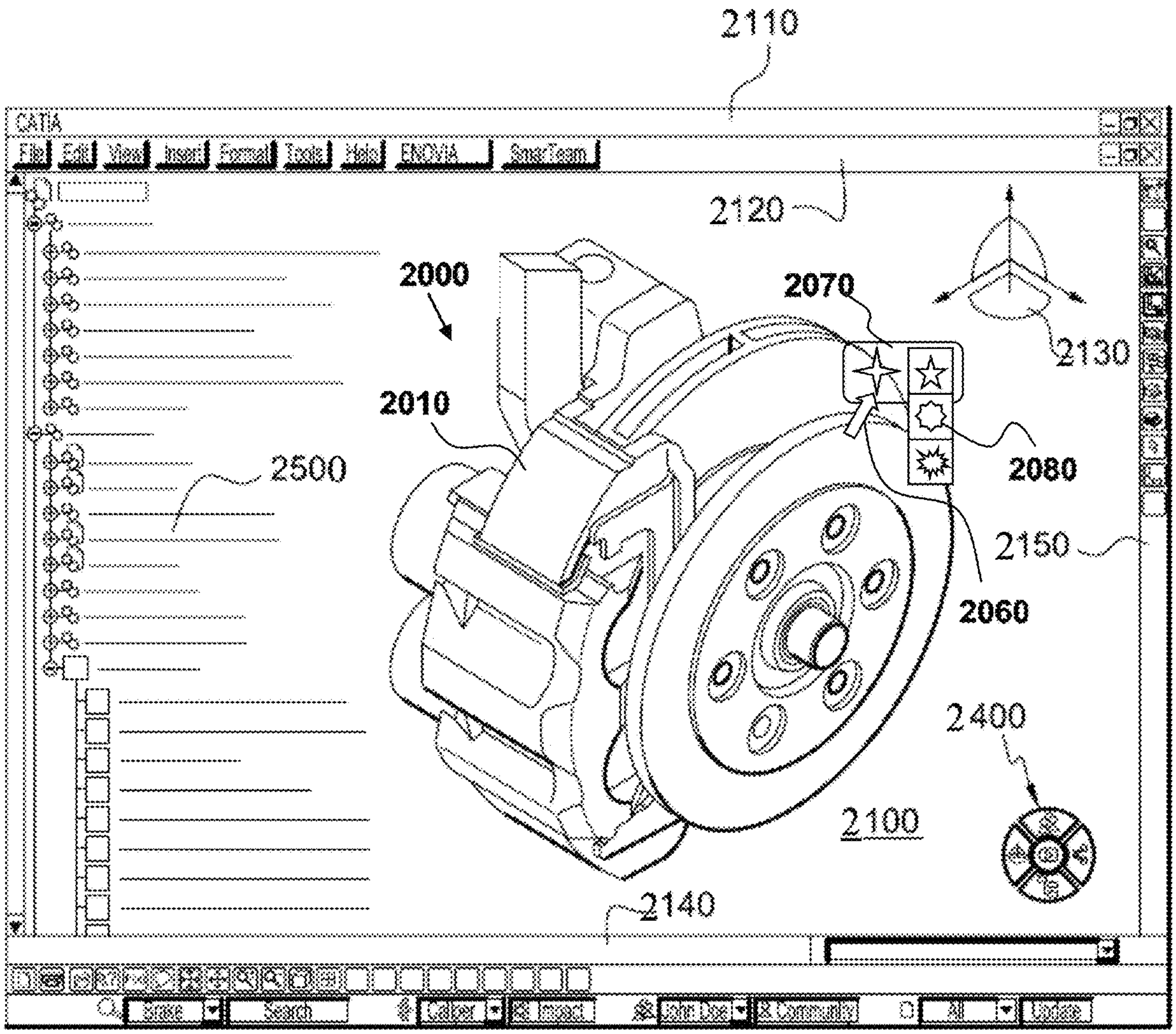
FIG. 3 shows an example of a graphical user interface of the system.

FIG. 3 shows an example of the GUI of the system, wherein the system is a CAD system and the modeled object 2000 is a 3D reconstruction of a mechanical object.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part 2010 of the object 2000 and then initiate an operation (e.g., change the dimension, color, etc.) or edit geometrical constraints by selecting an appropriate icon. For example, typical CAD operations are the modeling of the punching, or the folding of the 3D modeled object displayed on the screen. The GUI may for example display data 2500 related to the displayed product 2000. In the example of the figure, the data 2500, displayed as a "feature tree", and their 3D representation 2000 pertain to a brake assembly including brake caliper and disc. The GUI may further show various types of graphic tools 2130, 2070, 2080, 2400 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 4:
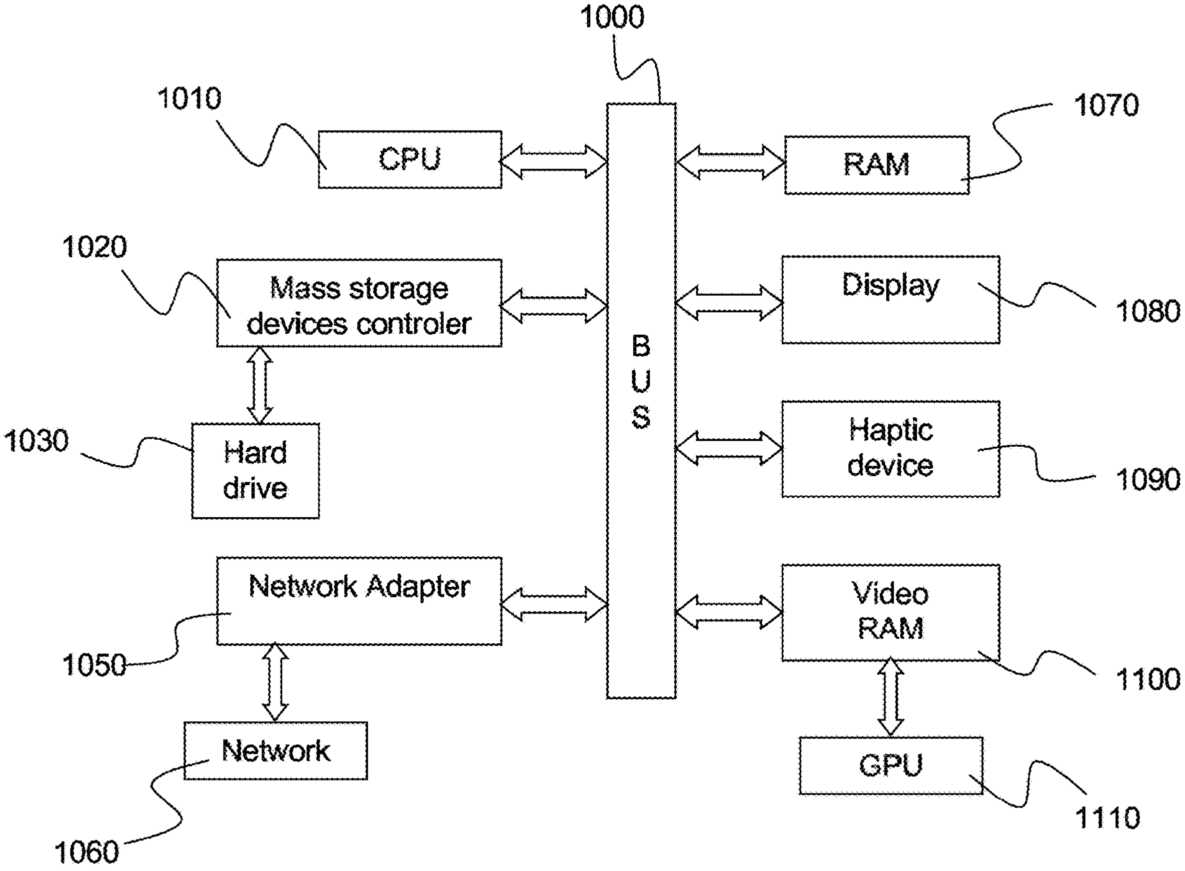
FIG. 4 shows an example of the system.

FIG. 4 shows an example of the system, wherein the system is a client computer system, e.g., a workstation of a user.

The client computer of the example comprises a central processing unit (CPU) 1010 connected to an internal communication BUS 1000, a random-access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method. The computer program may alternatively be stored and executed on a server of a cloud computing environment, the server being in communication across a network with one or more clients. In such a case a processing unit executes the instructions comprised by the program, thereby causing the method to be performed on the cloud computing environment.

Implementations of the methods are now discussed. Such implementations concern the fields of computer vision, deep learning and in particular, 3D reconstruction.

These implementations are focused on the reconstruction of simple and parametric 3D primitives (i.e., 3D primitive CAD objects): parameterized cylinders, boxes, and regular prisms.

Figure 5:
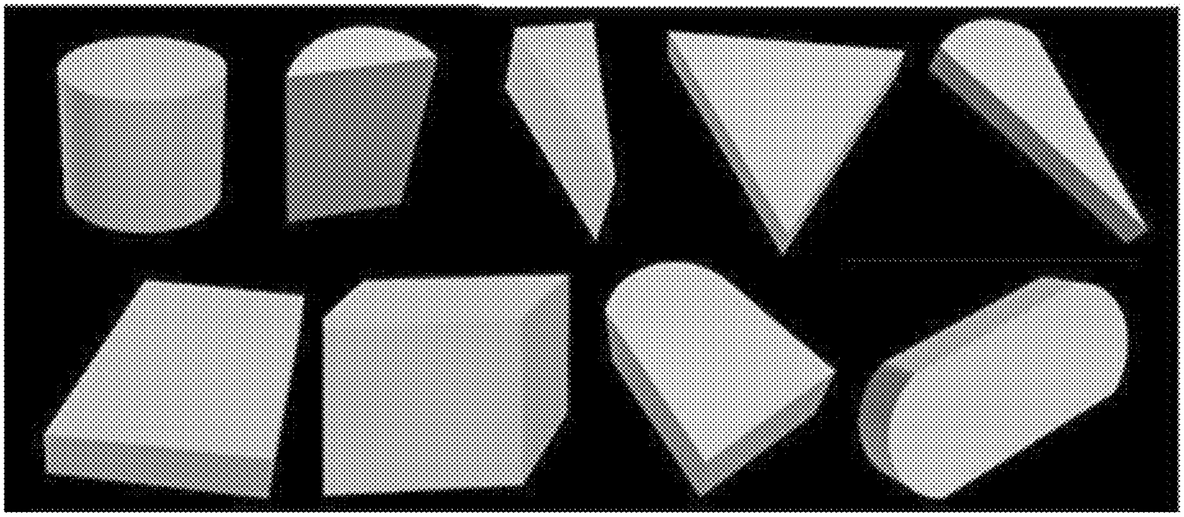
FIGS. 5, 6, 7, 8, 9, 10, 11, 12 and 13 illustrate the method.

FIG. 5 illustrates examples of such primitives. The 3D model of any of the 3D primitives is represented by a sweep representation such that each 3D primitive CAD object may be defined by a 3D planar section and a 3D straight extrusion line normal to the section.

In these implementations, each 3D primitive CAD object may be fully described by:

- a number of sides (nbSides) corresponding to the number of points defining the section. It can be also seen as the type of primitive. In the example, the maximum number of sides is restricted to be 5. Further, the number of sides 2 to 5 is attributed to cylinder, triangle prism, box or cube, and pentagonal prism, respectively;
- a set of 3D points (points) as a list of at most 5 3D points defining the points of the section. For example: points=[{($X_1$, $Y_1$, $Z_1$), . . . , {($X_5$, $Y_5$, $Z_5$)]
- a flag associated to each couple of points to represent the line type between each two consecutive points to set whether the respective side is a segment or an arc. The flag being equal to 0 represents a segment and the flag being equal to 1 represents an arc. The flag for all couple of points of a cylinder is 1, and for all couple of points of a box and a regular prism is 0; and
- an extrusion length representing for an extrusion direction perpendicular to the plane on which the 3D points lie.

In some variations, the implementations may use any shape represented with a CAD parametrization, such as an extruded shape (with a straight or curved extrusion curve) or revolved shapes. Such a CAD parametrization may be the CAD parametrization according to European Patent Application No 21305671.6 filed on 21 May 2021 by Dassault Systèmes.

The implementations comprise a pipeline method to reconstruct a 3D object by providing a natural image and a depth image representing a real object, i.e., from an RGB image and an associated depth image of an entire real scene containing the object to reconstruct. Such data can be obtained using devices having LIDAR technology. In said pipeline, an object is decomposed into multiple simple primitives. Furthermore, said pipeline comprise an intuitive 2D segmentation tool. Such a segmentations tool may function for example according to the method of the previously cited European Patent Application No. 20305874.8. In the implementations of such a pipeline, to reconstruct a whole object, the depth image is segmented. For example, a user may perform an individual segmentation for each part or each primitive of the object, assisted with a 2D segmentation tool. Said pipeline leverage 2.5D real data, i.e., an RGB image in association with a depth image to perform the 3D reconstruction. The pipeline may finally comprise an automatic 3D snapping tool to assemble different 3D reconstructions together to form the objects. In other words, each primitive should be re-arranged (e.g., placement and scale) with the help of, for example, an automatic 3D snapping tool.

The implementations also propose a method to train a deep neural network comprising an encoder taking as input a depth image and outputting a latent vector and a decoder taking as input the latent vector and outputting a CAD parametrization.

Such implementations do not rely on public training datasets that are not sufficient while being capable of handling generalization challenge (i.e., from the training data to practical situations) and outputting a CAD parametrization of the object. Furthermore, the implementations decompose the object into its multiple parts where each single part is much easier to reconstruct and can be approximated with a primitive. This strategy can be used to reconstruct any kind of objects that can be decomposed into a set of simple parts/primitives. This is usually the case for man-made objects which are usually regular (e.g., with symmetry). In addition, such implementations output a CAD parametrization of the primitive, which is a compact and easy to modify 3D representation.

Figure 6:
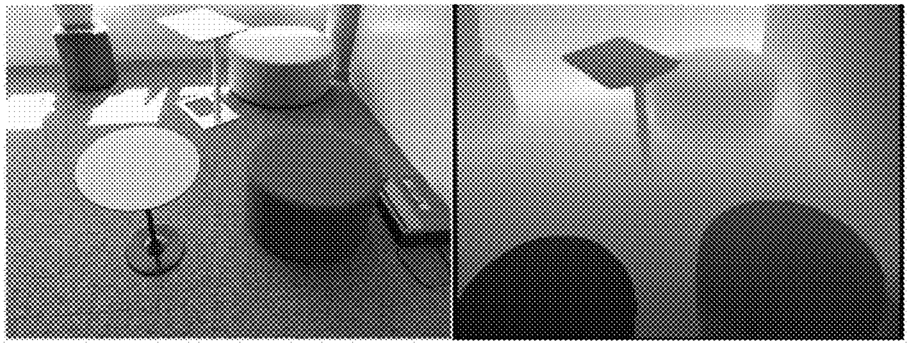

FIG. 6 shows a single capture of a real scene, e.g., by a camera, capturing an RGB (i.e., natural) image (on the left) and associated depth image (on the right). Each pixel intensity of the depth image equals the distance between the camera sensor and the 3D point of intersection of the real scene with a casted ray (associated to the pixel).

Figure 7:
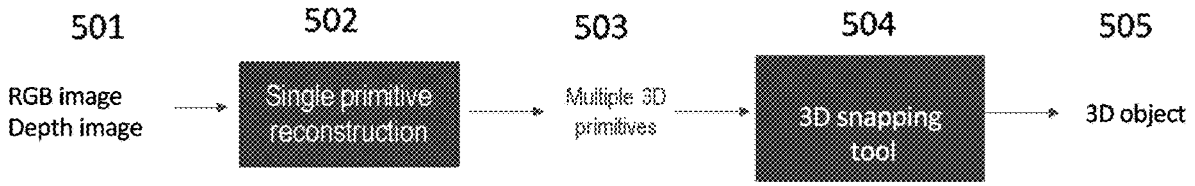

FIG. 7 presents an example pipeline of the implementations.

Provided an RGB image and an associated depth image in step 501, the implementations identify that each object in the single capture can be decomposed to, or at least approximated by, a set of basic parts or primitive in step 502 (i.e., "Single primitive reconstruction") in order to obtain multiple 3D primitives (at step 503). The implementations may accept user input (e.g., input strokes via a mouse or any haptic device) in order to identify each of the primitives composing the whole object (in order to segment the depth image based at least on the RGB image).

Figure 8:
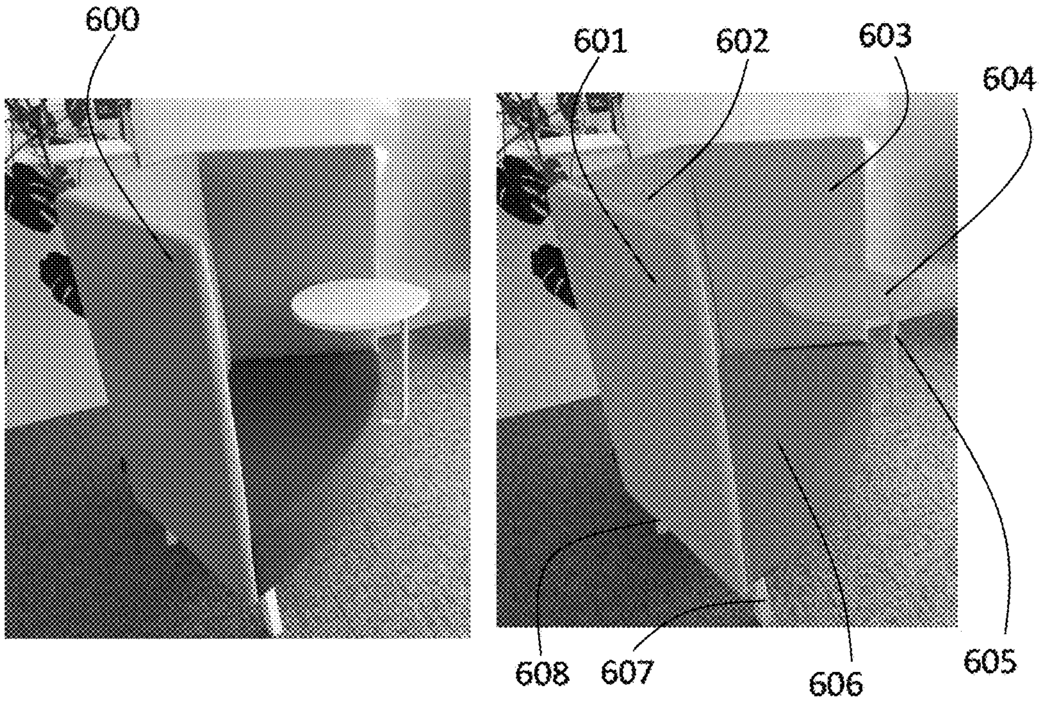

FIG. 8 presents an example of decomposition according to the method. FIG. 8 displays an original RGB image (left) containing an object to reconstruct (i.e., a chair 600), and a decomposition of the object into 8 simple primitives (601-608).

Back to FIG. 7, in step 502, the implementations reconstruct each of the identified primitives as discussed later. When each primitive is reconstructed in 3D, the implementations may run a 3D automatic snapping tool in step 504, in order to combine all of these primitives into one single 3D object 505.

Figure 9:
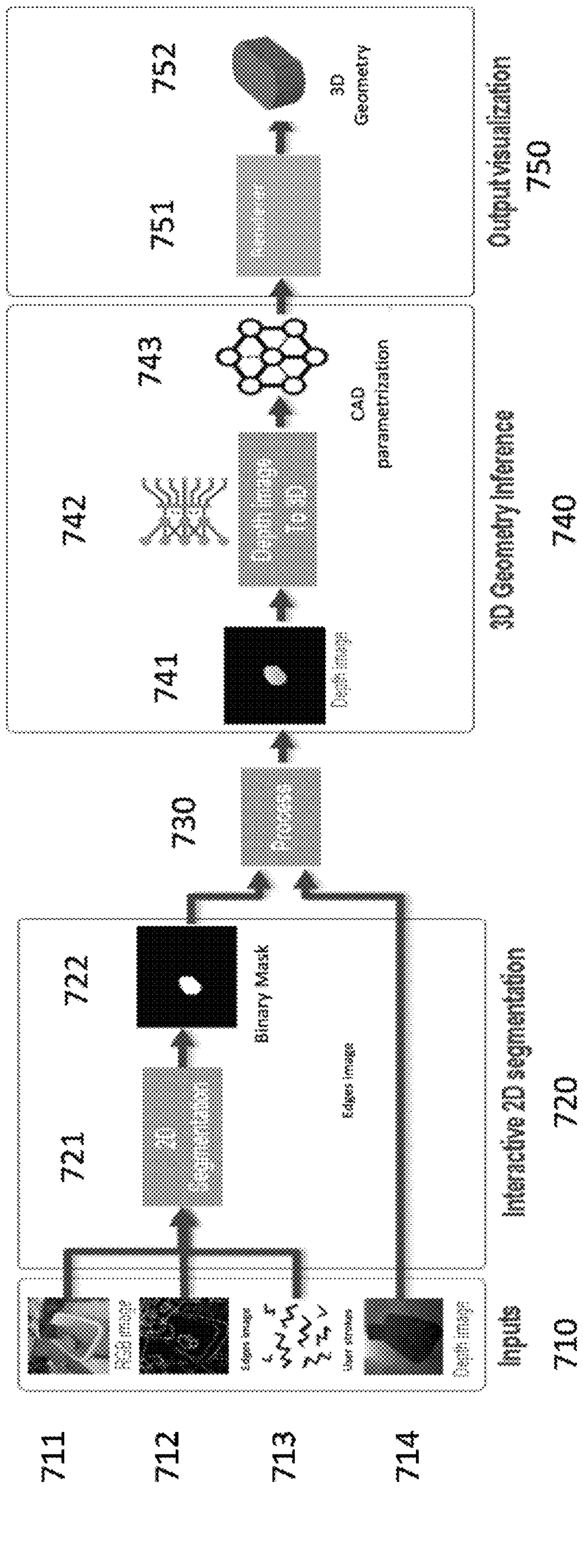

Example implementations of reconstruction of single primitives (i.e., 502 in FIG. 7) are now discussed in reference to FIG. 9.

In such examples, the implementations may accept user inputs 710 in an interactive 2D segmentation 720 to select each primitive in the input RGB image 711 one by one using a 2D segmentation tool 721. In such examples the user may draw simple strokes 713 on the input RGB image 711 to segment one primitive of interest and obtain a high quality 2D binary mask 722 of the primitive, for example according to the method of previously cited European Patent Application No. 20305874.8. Such a method computes the 2D mask using a graph-cut strategy, using as inputs the user strokes 713 and the edges image 712 (which is computed from the RGB image 711 for example by any known edge detection method as discussed above, for example the Canny method, the Sobel method, or a deep learning method). The implementations may use any other 2D segmentation tool, able to segment the image into multiple primitives, for example user guided methods such as graph Cuts and efficient N-D Image segmentation, or automatic methods such as semantic segmentation according to Chen et al. "Semantic image segmentation with deep convolutional nets and fully connected CRFS." arXiv preprint, arXiv:1412.7062, 2014 which is incorporated herein by reference.

Then, the implementations map each 2D binary image the 2D depth input image to obtain a segmented depth image. Upon this mapping, the implementations, set all background values of the segmented depth image to zero. The implementations, in a 3D geometry inference step 740, may process 730 the segmented depth image (as discussed later) to prepare the input 741 of a deep learning algorithm 742 that infers a CAD parametrization 743 of the primitive.

Finally, in an output visualization step 750, the implementations output visual feedback of the inferred primitive to be shown to the user, using a renderer to obtain a 3D geometry (e.g., a 3D mesh) from the CAD parametrization.

Example implementations of depth image processing are now discussed.

The implementations perform a binary pixel-wise operation from the binary mask and the depth map to obtain a segmented depth image (which background values are zero value). Then, the implementations compute a bounding rectangle of the foreground pixels (i.e., non-zero depth values) to center the primitive into the processed depth image. The implementations may then add zero values (i.e., padding) to the processed depth image to obtain a squared image, thereby obtaining a segmented squared depth image, with the primitive centered in the image.

In practice, there may be outlier (i.e., incorrect) pixel depth values in the depth image due do lidar sensor noise, 2D segmentation errors, object dependent depth noise (e.g., due to illumination, or texture). Such noise may be due to the real-world scene illumination (e.g., high light, no light, reflections, etc.) and/or from the object itself (e.g., texture, transparency, etc.) and lead to depth measure errors (e.g., in the depth measure sensor). In order to remove such outliers, the implementations may use the calibration of the camera (e.g., by using its intrinsic matrix, or default calibration if unknown, using image size and default FOV of 45° for example, without sensor distortion), to represent a depth image with a 3D point cloud. Using a 3D point cloud representation of the depth image, the implementations then remove the outlier pixels of the depth image, using a statistical point cloud outlier removal strategy. Such a removal strategy (according to open3D library) removes points (of the 3D point cloud) that are further away from their neighbors compared to the average for the 3D point cloud. The statistical point cloud outlier removal strategy takes two inputs as nb_neighbors which specifies how many neighbors are taken into account in order to calculate the average distance for a given point, and std_ratio, which allows setting the threshold level based on the standard deviation of the average distances across the point cloud. The lower this number, the more aggressive the filter is.

The implementations get the indexes of the computed outlier 3D points, and map said indexes to the pixel indexes of the depth image to set them to the zero value. The implementations may use multiple different parameters and other algorithms/strategies than said statistical point cloud outlier removal strategy for the outliers removal, leading to obtain multiple different depth images and then propose the multiple different 3D predicted primitives as proposals. The implementations may use the strategies that lead to obtain depth images close to the synthetic depth images in the training dataset. A deep neural network trained on such training dataset gives better 3D model predictions.

In example implementations, the architecture of the CNN in the deep neural network model is according to the AlexNet (see en.wikipedia.org/wiki/AlexNet), which is adequate for depth image input.

Example implementations of (training) dataset generation according to the dataset-forming method are now discussed. In such implementations, to generate the synthetic dataset, the implementations synthetize 3D primitive CAD objects by generate random 3D primitives from random CAD parameters.

The implementations may perform a random sampling on the number of sides of the section, thus nbSides is sampled according to the uniform probability distribution from the integers in the interval [2, 5]. In a variation of this example, nbSides is sampled according to a non-uniform probability distribution from the integers in the interval [2, 5]. The non-uniform probability distribution has larger values for a cylinder (nbSides=2) and a box (nbSides=4) compared to other values for nbSides, as cylinders and boxes appears more often in practical 3D designs. A uniform sampling is done for the extrusion length (h) between a maximum and minimum value of the interval $[h_{min}, h_{max}]$ The value $h_{min}$ and $h_{max}$ are set by the user or set to a default automatically by the dataset-forming method, e.g., to 1 and 10, respectively. Further, the parameter points are computed to obtain a regular section for the prisms when nbSides=3 or 5, for example by choosing nbSides number of points on a circle at a uniform distance. The chosen points are then sorted in an ascending order of their corresponding angles in the polar coordinate system. For boxes, nbSides=4, after obtaining a regular section as for other prisms, a new random parameter (r) is sampled uniformly, corresponding to the length ratio between the two sides, between a maximum and minimum value of the interval $[r_{min}, r_{max}]$ The value $r_{min}$ and $r_{max}$ are set by the user or set to a default automatically by the dataset-forming method, e.g., to 1 and 10, respectively. In an option of the dataset-forming method, the method generates a non-regular section for the 3D model when nbSides=3, 4 or 5, for example by choosing nbSides number of points inside a unit disc. The chosen points are then sorted in an ascending order of their corresponding angles in the polar coordinate system. A 3D primitive CAD object is sampled from the cross product of the mentioned sampling.

Figure 10:
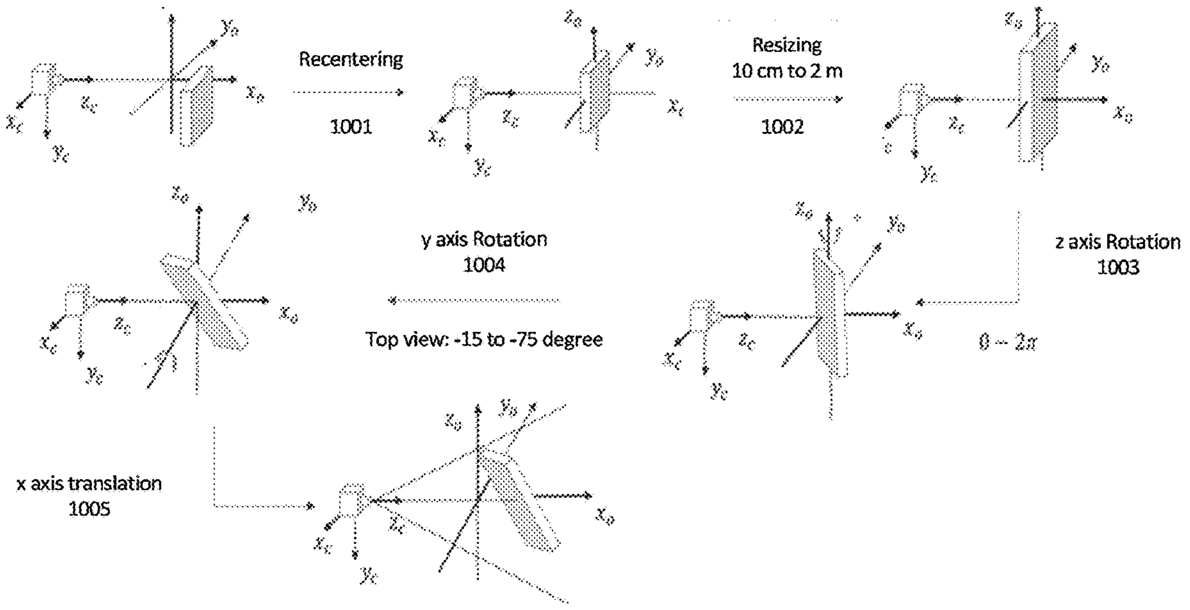

In reference to FIG. 10, the implementations then use a non-photo realistic rendering virtual camera to get a depth image (e.g., size h=192, w=256, similar to Lidar technology depth images) of the primitive, calibrated from a fixed viewpoint and with fixed intrinsic parameters. The camera may be positioned at (−1.7, 0, 0), and looking at (0, 0, 0) point. The virtual camera provides synthetic renderings (i.e., non-photos) which do not include any noise (which may be included in an actual camera rendering). Then, the implementations apply some transformations to the random generated primitive including one or more of centering 1001 in (0, 0, 0), resizing 1002 to fit in a sphere of random diameter between 10 cm and 2 m, applying a z-axis-rotation 1003 with a random angle between 0° and 360°, applying a y-axis-rotation 1004 with a random angle between −15° and −75°, and applying a x-axis-translation 1005 with a random distance between two values depending on the bounding sphere diameter of the primitive.

Thus, the implementations obtain a dataset of random depth images, with associated CAD parameters with zero-depth-values for the background pixels and non-zero values for the foreground (primitive) pixels. Then, the implementations may add zero values in order to obtain a squared image of size (256, 256).

The non-photo realistic rendering virtual camera according to the dataset generation discussed above does not simulate real data noise, which are a combination of real sensor noise, object-dependent real depth noise and/or eventual occlusion(s).

Figure 11:
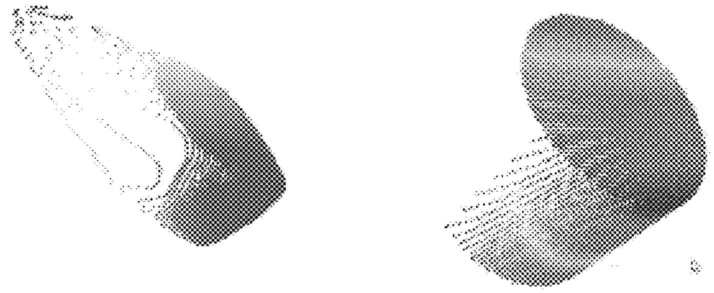

An example of this noise is presented in FIG. 11 which shows on the left a real depth image of an object (without outlier pixels removal process discussed above), and on the right a generated depth image of a primitive with a similar shape (cylindrical shape). In order to visualize the depth images, a point cloud representation is used (darker points are closest points, lighter points are farthest points).

Figure 12:
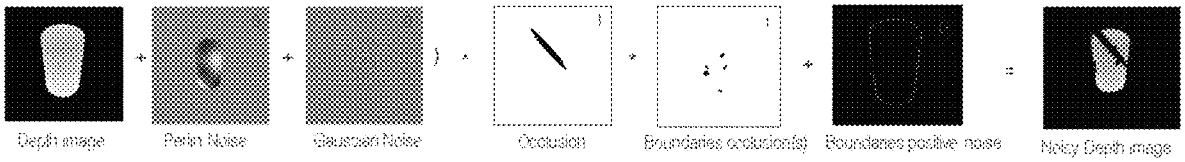

In reference to FIG. 12, the implementations add random synthetic noise to the generated datasets, in order to make said datasets closer to real images. In examples, the implementations may apply the implementation apply the following steps to an input depth image (from a generated dataset): i) adding 1210 random 2D Perlin Noise on every foreground pixel, with a frequency and amplitude depending on the (geometrical) size of the primitive, ii) adding 1220 random Gaussian Noise N(0, 0.002) on every foreground pixel, iii) adding 1230 absolute value of random Gaussian Noise N(0, 0.1) on the boundaries of the foreground pixels, iv) adding 1240 zero or one random occlusion with elliptic or rectangular shape, that can occlude between 5% to 50% of the foreground pixels, v) adding 1250 a random number, with a maximum number depending on the number of foreground pixels, of occlusions near the boundaries of the foreground pixels. These occlusions can be elliptic or rectangular shapes with parameter lengths from 3 to 10 pixels. A goal of adding the random 2D Perlin Noise is to slightly ripple the surfaces (and therefore the depth values of the corresponding depth image) of the primitive CAD objects. It is also not realistic to add several waves on a surface. The method may therefore comprise adapting the frequency of the ripple according to the size of the primitive, so that the ripple can be visible, but without forming more than a single hill or valley as a ripple.

FIG. 12 illustrates an example of random noises images applied with the specific + or * operators which are pixel-wise operators between two images with a same size, meaning that the + or * operation is mapped to each pixel. The background pixels of the Perlin noise image, the Gaussian noise image and the boundary positive noise are value 0, brighter pixel colors mean greater positive values, and darker pixel colors mean greater negative values. For the occlusion mask image and the boundaries occlusion(s) mask image, the background values are 1, and the foreground values are value 0.

Figure 13:
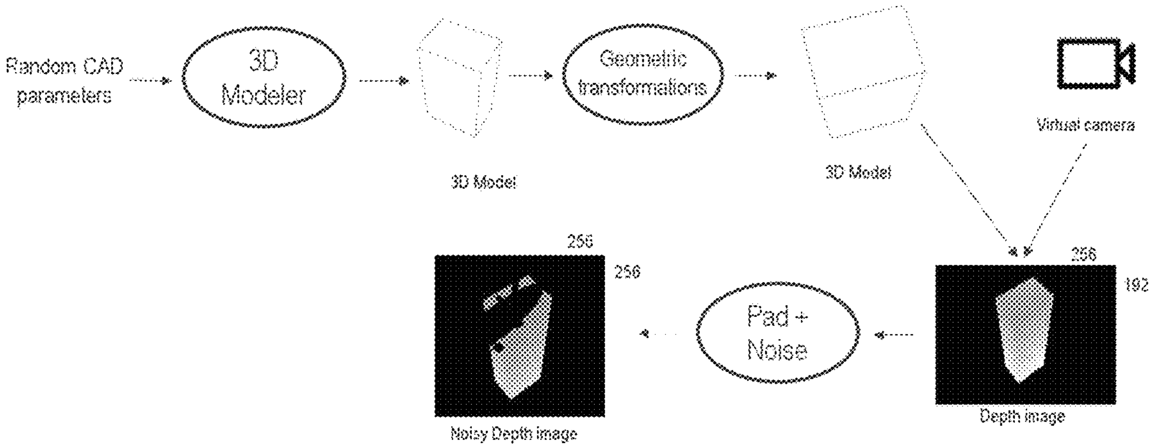

FIG. 13, presents a general pipeline of the dataset generation as discussed above.

The invention claimed is:

1. A computer-implemented method of 3D reconstruction of at least one real object including an assembly of parts, the method comprising:

obtaining a neural network configured for generating a 3D primitive CAD object based on an input depth image, the 3D primitive CAD object being defined by sweeping a section along a guide curve, the section being a polygon, a rounded polygon, or a set of one or more curves which forms a closed region, the guide curve being a straight line or a continuous curve;

obtaining (i) a color or grayscale photograph displaying a real-world scene including the real object and (ii) a depth image representing the real object;

segmenting the depth image based at least on the color or grayscale photograph, each segment representing at most a respective part of the assembly;

obtaining a plurality of pieces of data each representing a respective segment, the plurality of pieces of data comprising at least two different pieces of data;

applying the neural network to each piece of data separately, each separate application of the neural network resulting in a respective single 3D primitive CAD object; and after applying the neural network to each piece of data separately and thereby obtaining multiple 3D primitive CAD objects, combining the 3D primitive CAD objects obtained from each segment in order to construct the 3D reconstruction of the real object.

2. The computer-implemented method of claim 1, wherein the neural network includes a convolutional network (CNN) that takes the depth image as input and outputs a respective latent vector, and a sub-network that takes the respective latent vector as input and outputs values of a predetermined 3D primitive CAD object parameterization.

3. The computer-implemented method of claim 1, wherein the 3D primitive CAD object is defined by a section and an extrusion, the section being defined by a list of positional parameters and a list of line types, and the neural network comprises a recurrent neural network (RNN) configured to output a value for the list of positional parameters and the list of line types.

4. The computer-implemented method of claim 3, wherein the neural network further includes a fully connected layer that outputs value of one or more parameters defining the extrusion.

5. The computer-implemented method of claim 4, wherein the section is further defined by a number representing a type of the section, the neural network being further configured to compute a vector representing a probability distribution for the number, and, optionally, the outputting of the value for the one or more parameters defining the extrusion, the list of positional parameters, and/or for the list of line types, is further based on the vector representing the probability distribution.

6. The computer-implemented method of claim 5, wherein the neural network includes:

a first part including:

a first subpart comprising a convolutional network (CNN), the CNN being configured to take the depth image as input and to output a respective latent vector, and a second subpart which is configured to take the respective latent vector of the CNN as input and to output the vector representing a probability distribution for the number; and a second part including:

a third subpart which is configured to take as input a concatenation of the respective latent vector of the CNN and the vector representing the probability distribution, and to output a respective vector, a fourth subpart which is configured to take as input the respective vector of the third subpart and to output a value for the list of positional parameters, a value for the list of line types, and a fixed-length vector, and a fifth subpart which is configured to take as input a concatenation of the respective vector of the third subpart and the respective fixed-length vector of the fourth subpart, and to output a value for the one or more parameters defining the extrusion.

7. The computer-implemented method of claim 1, further comprising before applying the neural network to each segment:

removing outliers from the segment; and/or recentering the segment.

8. A computer-implemented method for training the neural network according to claim 1, the method comprising:

obtaining a dataset of training samples each including a respective depth image and a ground truth 3D primitive CAD object; and training the neural network based on the dataset.

9. A computer-implemented method for forming the dataset of training samples according to claim 8 each including a respective depth image and a ground truth 3D primitive CAD object, further comprising:

synthesizing 3D primitive CAD objects; and generating a respective depth image of each synthesized 3D primitive CAD object.

10. The method of claim 9, wherein generating a respective depth image of each synthesized 3D primitive CAD object further comprises rendering the synthesized 3D primitive CAD object with respect to a virtual camera thereby obtaining a set of pixels, and, optionally, the synthesized 3D primitive CAD object is subjected to one or more transformation before the rendering.

11. The method of claim 10, further comprising adding a random noise to at least part of the pixels.

12. The method of claim 10, further comprising adding a random occlusion to at least part of the pixels.

13. The computer-implemented method of claim 1, wherein segmenting the depth image based at least on the color or grayscale photograph includes obtaining an edges image by applying an edge-detection method to the color or grayscale photograph.

14. The computer-implemented method of claim 1, wherein the combining includes a snapping method, the snapping method including defining a relation between one or more generated 3D primitive CAD objects.

15. The method of claim 1, wherein applying the neural network to each piece of data is performed independently of any other application of the neural network to another piece of data.

16. The computer-implemented method of claim 1, wherein the combining comprises a snapping method, the snapping method comprising displacement and scaling of one or more generated 3D primitive CAD objects relative to each other in a virtual scene.

17. A non-transitory computer readable storage medium having recorded thereon a computer program having instructions for performing a computer-implemented method of 3D reconstruction of at least one real object comprising an assembly of parts, the method comprising:

obtaining a neural network configured for generating a 3D primitive CAD object based on an input depth image, the 3D primitive CAD object being defined by sweeping a section along a guide curve, the section being a polygon, a rounded polygon, or a set of one or more curves which forms a closed region, the guide curve being straight line or a continuous curve;

obtaining (i) a color or grayscale photograph displaying a real world scene including the real object and (ii) a depth image representing the real object;

segmenting the depth image based at least on the color or grayscale photograph, each segment representing at most a respective part of the assembly;

obtaining a plurality of pieces of data each representing a respective segment, the plurality of pieces of data comprising at least two different pieces of data;

applying the neural network to each piece of data separately, each separate application of the neural network resulting in a respective single 3D primitive CAD object; and after applying the neural network to each piece of data separately and thereby obtaining multiple 3D primitive CAD objects, combining the 3D primitive CAD objects obtained from each segment in order to construct the 3D reconstruction of the real object.

18. The non-transitory computer readable storage medium of claim 17, wherein the neural network includes a convolutional network (CNN) that takes the depth image as input and outputs a respective latent vector, and a sub-network that takes the respective latent vector as input and outputs values of a predetermined 3D primitive CAD object parameterization.

19. The non-transitory computer readable storage medium of claim 17, wherein the 3D primitive CAD object is defined by a section and an extrusion, the section being defined by a list of positional parameters and a list of line types, and the neural network comprises a recurrent neural network (RNN) configured to output a value for the list of positional parameters and the list of line types.

20. The non-transitory computer readable storage medium of claim 17, wherein the computer program further includes instructions for performing a computer-implemented method for training the neural network, the method comprising:

obtaining a dataset of training samples each including a respective depth image and a ground truth 3D primitive CAD object; and training the neural network based on the dataset.

21. A system comprising:

a processor coupled to a memory, the memory having recorded thereon a computer program having instructions for performing 3D reconstruction of at least one real object comprising an assembly of parts that when executed by the processor causes the processor to be configured to:

obtain a neural network configured for generating a 3D primitive CAD object based on an input depth image, the 3D primitive CAD object being defined by sweeping a section along a guide curve, the section being a polygon, a rounded polygon, or a set of one or more curves which forms a closed region, the guide curve being straight line or a continuous curve;

obtain (i) a color or grayscale photograph displaying a real world scene including the real object and (ii) a depth image representing the real object;

segment the depth image based at least on the color or grayscale photograph, each segment representing at most a respective part of the assembly;

obtain a plurality of pieces of data each representing a respective segment, the plurality of pieces of data comprising at least two different pieces of data;

apply the neural network to each piece of data separately, each separate application of the neural network resulting in a respective single 3D primitive CAD object; and after applying the neural network to each piece of data separately and thereby obtaining multiple 3D primitive CAD objects, combining the 3D primitive CAD objects obtained from each segment in order to construct the 3D reconstruction of the real object.

22. The system of claim 21, wherein the neural network includes a convolutional network (CNN) that takes the depth image as input and outputs a respective latent vector, and a sub-network that takes the respective latent vector as input and outputs values of a predetermined 3D primitive CAD object parameterization.

23. The system of claim 21, wherein the 3D primitive CAD object is defined by a section and an extrusion, the section being defined by a list of positional parameters and a list of line types, and the neural network comprises a recurrent neural network (RNN) configured to output a value for the list of positional parameters and the list of line types.

24. The system of claim 21, wherein the computer program further includes instructions for performing a computer-implemented method for training the neural network that when executed by the processor causes the processor to be configured to:

obtain a dataset of training samples each including a respective depth image and a ground truth 3D primitive CAD object; and train the neural network based on the dataset.

* * * * *